United States Patent
Kim et al.

(10) Patent No.: US 8,786,009 B2
(45) Date of Patent: Jul. 22, 2014

(54) SUBSTRATE STRUCTURES INCLUDING BURIED WIRING, SEMICONDUCTOR DEVICES INCLUDING SUBSTRATE STRUCTURES, AND METHOD OF FABRICATING THE SAME

(75) Inventors: Kang-Uk Kim, Seoul (KR); Yong-Chul Oh, Paldal-gu (KR); Hui-Jung Kim, Seongnam-si (KR); Hyun-Woo Chung, Seoul (KR); Hyun-Gi Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 255 days.

(21) Appl. No.: 12/902,247

(22) Filed: Oct. 12, 2010

(65) Prior Publication Data
US 2011/0101445 A1 May 5, 2011

(30) Foreign Application Priority Data

Nov. 3, 2009 (KR) .......... 10-2009-0105400
Mar. 23, 2010 (KR) .......... 10-2010-0025734

(51) Int. Cl.
*H01L 29/78* (2006.01)
(52) U.S. Cl.
USPC ............ 257/328; 257/329; 257/330; 257/334
(58) Field of Classification Search
USPC ........................ 257/328–330, 334
See application file for complete search history.

(56) References Cited

U.S. PATENT DOCUMENTS

| 4,826,787 | A | * | 5/1989 | Muto et al. ............ 228/193 |
| 5,387,555 | A | | 2/1995 | Linn et al. |
| 5,825,090 | A | * | 10/1998 | Piccone ............ 257/747 |
| 6,057,212 | A | | 5/2000 | Chan et al. |
| 6,350,653 | B1 | * | 2/2002 | Adkisson et al. ........ 438/258 |
| 6,597,031 | B2 | * | 7/2003 | Kuge ............ 257/295 |
| 6,633,061 | B2 | * | 10/2003 | Lutzen et al. ........ 257/305 |
| 7,315,466 | B2 | * | 1/2008 | Han et al. ............ 365/154 |
| 7,372,091 | B2 | * | 5/2008 | Leslie ............ 257/296 |
| 7,470,923 | B2 | * | 12/2008 | Takaura et al. ........ 257/4 |
| 8,012,834 | B2 | * | 9/2011 | Lee ............ 438/270 |
| 2005/0111247 | A1 | * | 5/2005 | Takaura et al. ........ 365/2 |
| 2007/0152255 | A1 | * | 7/2007 | Seo et al. ........ 257/302 |
| 2010/0123188 | A1 | * | 5/2010 | Venkatraman ........ 257/330 |
| 2010/0163976 | A1 | * | 7/2010 | Lee et al. ........ 257/330 |
| 2011/0183488 | A1 | * | 7/2011 | Takaishi ............ 438/381 |
| 2011/0186968 | A1 | * | 8/2011 | Kishida ............ 257/621 |

FOREIGN PATENT DOCUMENTS

JP  09-082918  3/1997

* cited by examiner

*Primary Examiner* — Eugene Lee
(74) *Attorney, Agent, or Firm* — Volentine & Whitt, PLLC

(57) ABSTRACT

A semiconductor device includes a substrate structure including a first substrate and a second substrate, and a buried wiring interposed between the first substrate and the second structure, where the buried wiring is in direct contact with the second substrate. The semiconductor device further includes a vertical transistor located in the second substrate of the substrate structure. The vertical transistor includes a gate electrode and a semiconductor pillar, and the buried wiring is one of source electrode or a drain electrode of the vertical transistor.

19 Claims, 29 Drawing Sheets

SUBSTRATE STRUCTURES INCLUDING BURIED WIRING, SEMICONDUCTOR DEVICES INCLUDING SUBSTRATE STRUCTURES, AND METHOD OF FABRICATING THE SAME

CROSS-REFERENCE TO RELATED APPLICATIONS

A claim of priorities are made to Korean patent application No. 2009-105400, filed on Nov. 3, 2009 and Korean patent application No. 2010-25734, filed on Mar. 23, 2010, in the Korean Intellectual Property Office, the disclosures of which are incorporated herein by reference in their entireties.

BACKGROUND

The inventive concepts herein generally relate to semiconductor devices, and more particularly, the inventive concepts relate to substrate structures which include buried wiring, to semiconductor devices containing substrate structures including buried wiring, and to methods of fabricating the same.

As semiconductor devices are becoming highly integrated, sizes of source/drain regions and width of gate electrodes and metal wiring in semiconductor devices are being rapidly decreased. Thus, multi-layered wirings have been widely used as a wiring structure of the semiconductor device in which a number of wiring layers are sequentially stacked in a vertical direction and each of the wiring layers are electrically connected to each other by interconnections such as a contact plug.

In general, the wirings in a semiconductor device are electrically connected to underlying conductive structures such as transistors and are separated from each other by a number of insulation inter-layers. Then, the insulated upper and lower wirings are electrically connected to each other by the interconnections penetrating through the insulation interlayer.

These types of multi-layered wiring structures are becoming increasingly difficult to implement as design rules continue to decrease, particular in memory cell regions of semiconductor memory devices. For example, it may be difficult to overcome limitations of photolithography processes and ensure sufficient process margins because of resolution limits. Further, parasitic capacitances and the like can adversely impact electrical characteristics as wiring structures become increasingly integrated.

SUMMARY

According to an aspect of the inventive concepts, a substrate structure is provided which includes a first substrate and a second structure, and a buried wiring interposed between the first substrate and the second structure, where the buried wiring is in direct contact with the second substrate.

According to another aspect of the inventive concepts, a semiconductor device is provided which includes a substrate structure including a first substrate and a second substrate, and a buried wiring interposed between the first substrate and the second structure, where the buried wiring is in direct contact with the second substrate. The semiconductor device further includes a vertical transistor located in the second substrate of the substrate structure. The vertical transistor includes a gate electrode and a semiconductor pillar, and the buried wiring is one of source electrode or a drain electrode of the vertical transistor.

According to yet another aspect of the inventive concepts, a method of fabricating a substrate structure is provided. The method includes forming an insulating layer on a first substrate, forming a barrier layer on a semiconductor layer of a second substrate, the second substrate including a sacrificial layer opposite the semiconductor layer, forming a wiring layer on the barrier layer, attaching the first substrate to the second substrate such that the insulating layer of the first substrate confronts the wiring layer of the second substrate, and removing the sacrificial layer of the second substrate.

BRIEF DESCRIPTION OF THE DRAWINGS

The above and other aspects of the inventive concepts will become readily apparent from the detailed description that follows, with reference to the accompany drawings, in which.

DETAILED DESCRIPTION OF EMBODIMENTS

Figure 1:
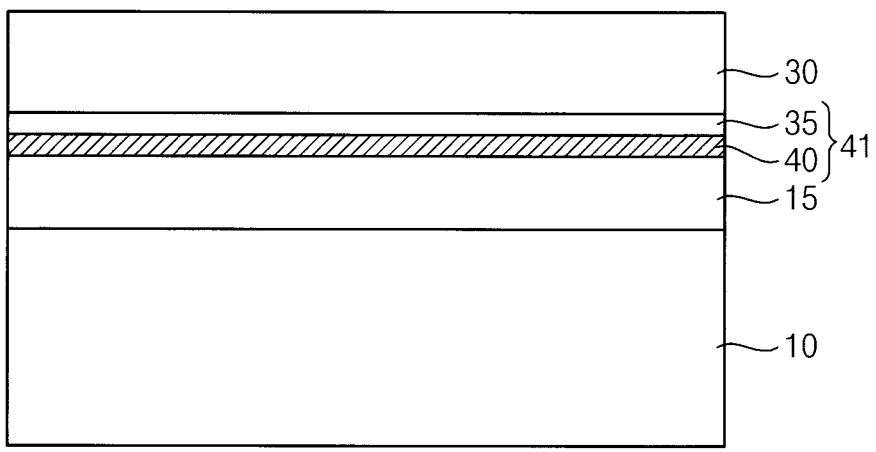
FIG. 1 is a cross-sectional view of a substrate structure according to an embodiment of the inventive concepts.

Various example embodiments are described with reference to the accompanying drawings, where like reference numbers are used to denote like or similar elements. The inventive concepts may, however, be embodied in many different forms and should not be construed as limited to the embodiments set forth herein.

In the drawings, the relative dimensions of device layers may be exaggerated for clarity. That is, for example, the relative thicknesses and/or widths of layers may be varied from those depicted. For example, unless the description clearly indicates otherwise, if a first layer is shown as being thicker than a second layer, the two layers may instead have the same thickness or the second layer may be thicker than the first layer.

To facilitate understanding, a number of non-limiting descriptive terms may be utilized which are not intended to define the scope of the inventive concepts. For example, although the terms "first", "second", etc. may be used herein to describe various elements, these elements should not be limited by these terms. These terms are simply used to distinguish one element from another. For example, a first element could be termed a second element, and, similarly, a second element could be termed a first element, without departing from or limiting the scope of the inventive concepts. Likewise, the words "over", "under", "above", "below", etc. are relative terms which are not intended to limit the inventive concepts to a particular device orientation. As used herein, the term "and/or" includes any and all combinations of one or more of the associated listed items.

Further, the terminology utilized herein often makes reference to a "layer" of material. It will be understood that the inventive concepts are not limited to single-layer structures when reference is made to a layer of material. For example, an insulating layer can actually encompass multiple layers of insulating material which essentially achieve the same insulating functions as a single insulating layer of material. This same reasoning is to be applied to semiconductor and conductive regions as well.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An embodiment of the inventive concepts will now be described with reference to the cross-sectional view of FIG. 1. In particular, FIG. 1 is a cross-sectional view of a substrate structure including a buried wiring according to an embodiment of the inventive concepts.

Referring to FIG. 1, the substrate structure of this example includes a first substrate 10 and a second substrate 30. Examples of the first substrate 10 and the second substrate 30 may include a silicon substrate, a germanium substrate, a silicon-germanium substrate, a SOI (Silicon-On-Insulator) substrate, a GOI (Germanium-On-Insulator) substrate, a metal oxide substrate such as an aluminum oxide $(AlO_x)$ substrate, etc. The first and the second substrates 10 and 30 may be formed of the same substrate material or different substrate materials.

In the example of this embodiment, an insulating layer 15 and a buried wiring 41 are stacked between the first and the second substrates 10 and 30 as shown in FIG. 1. In the example of this embodiment, the buried wiring 41 includes a barrier layer 35 and a conductive wiring layer 40. In an alternative embodiment, the barrier layer 35 may be omitted, and the buried wiring 41 may be defined by the conductive wiring layer 40.

Material examples of the insulating layer 15 may include oxides and/or other dielectric materials. For example, the insulating layer 15 may include high density plasma-chemical vapor deposition (HDP-CVD) oxide, phosphor silicate glass (PSG), undoped silicate glass (USG), spin on glass (SOG), flowable oxide (FOX), boro-phosphor silicate glass (BPSG), tetraethylorthosilicate (TEOS), plasma enhanced-TEOS (PE-TEOS), fluoride silicate glass (FSG), Tonen Silazene (TOSZ®) and combinations of any one or more of these.

Material examples of the conductive wiring layer 40 may include doped polysilicon, tungsten (W), titanium (Ti), tantalum (Ta), molybdenum (Mo), iridium (Ir), hafnium (Hf), zirconium (Zr), ruthenium (Ru), platinum (Pt), nickel (Ni), aluminum (Al), tungsten nitride $(WN_x)$, aluminum nitride $(AlN_x)$, tantalum nitride $(TaN_x)$, titanium nitride $(TiN_x)$, titanium aluminum nitride $(TiAl_xN_y)$, molybdenum nitride $(MoN_x)$, hafnium nitride $(HfN_x)$, zirconium nitride $(ZrN_x)$, and combinations of any one or more of these. The conductive wiring layer 40 may have a multi-layer structure that includes at least one doped polysilicon film, at least one metal film and/or at least one metal compound film. Alternatively, the conductive wiring layer 40 may have a single-layer structure which includes a doped polysilicon layer, a metal layer or a metal compound layer.

Material examples of the barrier layer 35 may include Ti, $TiN_x$, titanium silicide $(TiSi_x)$, Ta, $TaN_x$, tantalum silicide $(TaSi_x)$, Mo, $MoN_x$, Hf, $HfN_x$, W, $WN_x$, tungsten silicide $(WSi_x)$, Zr, $ZrN_x$, zirconium silicide $(ZrSi_x)$, Ni, nickel silicide $(NiSi_x)$, Al, $AlN_x$, cobalt silicide $(CoSi_x)$, and combinations of two or more of these. The barrier layer 35 may have a multi-layer structure that includes at least one metal film and/or at least one metal compound film. Alternatively, the barrier layer 35 may have a single-layer structure which includes a metal layer or a metal compound layer. The barrier layer 35 may prevent metal atoms and/or conductive ingredients in the conductive layer 40 from being diffused into the second substrate 30. Further, the barrier layer 35 may prevent semiconductor ingredients in the second substrate 30 from diffusing into the conductive layer 40.

In the example of the illustrated embodiment, the barrier layer 35 may reduce an interface resistance between the conductive wiring layer 40 and the second substrate 30 when the barrier layer 35 includes metal silicide. Additionally, the barrier layer 35 may increase the adhesion strength between the conductive wiring layer 40 and the second substrate 30.

In the example of the illustrated embodiment, an upper surface of the buried wiring 41 may directly contact the second substrate 30. That is, in the illustrated example, an upper surface of the barrier layer 35 directly contacts a lower surface of the second substrate 30. However, as mentioned above, an alternative embodiment is where all or part of the barrier layer 35 may be omitted. In this case, all or part of an upper surface of the conductive wiring layer 40 may directly contact the second substrate 30. The buried wiring 41 may serve various wirings, for example, a bit line in a cell region of a semiconductor device, a connection line in a peripheral circuit region of a semiconductor device, etc.

A method of fabricating the substrate structure of FIG. 1 will now be described with reference to the cross-sectional views of FIG. 2A through FIG. 2C.

Figure 2A:
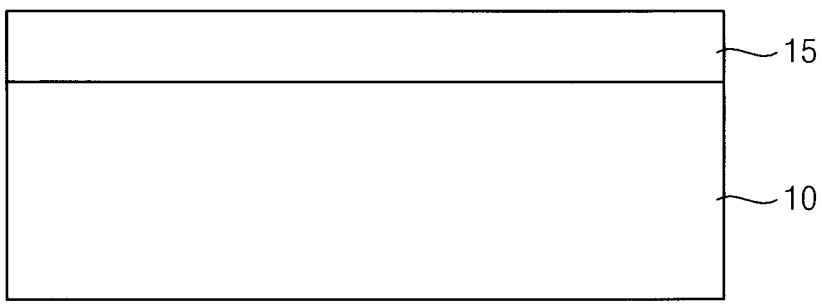
FIGS. 2A through 2C and FIG. 3 are cross-sectional views for use in explaining a method of fabricating the substrate structure of FIG. 1 according to an embodiment of the inventive concepts.

Referring to FIG. 2A, an insulating layer 15 is formed on a surface of a first substrate 10. The method of formation is not limited, and conventional deposition techniques may be utilized to form the insulating layer 15. For example, the insulating layer 15 may be obtained by a thermal oxidation process, a radical oxidation process, a chemical vapor deposition (CVD) process, a plasma enhanced CVD (PECVD) process, a spin coating process, an HDP-CVD process, etc. When the first substrate 10 includes silicon, the insulating layer 15 may include silicon oxide.

Figure 2B:
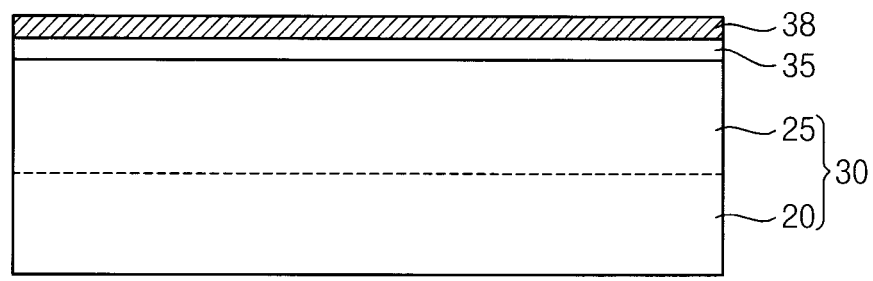

Referring next to FIG. 2B, a second substrate 30 is provided which includes a semiconductor layer 25 and a sacrificial layer 20. The second substrate 30 may be formed of a single contiguous material, in which case the semiconductor layer 25 and sacrificial layer 20 may be formed of the same material. In this case, the sacrificial layer 20 simply defines a portion of the second substrate 30 that is to be later removed. Alternatively, the sacrificial layer 20 may constitute a different material layer than the semiconductor layer 25.

In the example of the illustrated embodiment, the sacrificial layer 20 may include a material substantially the same as or substantially similar to that of the semiconductor layer 25. For example, the sacrificial layer 20 and the semiconductor layer 25 may include silicon, germanium, silicon-germanium, etc.

Still referring to FIG. 2B, a barrier layer 35 is formed on a surface of the second substrate 30 opposite the sacrificial layer 20, and a wiring layer 38 (which forms the conductive wiring layer 40 of the fabricated substrate structure) is formed on the surface of the barrier layer 35. Here, the methods of formation not limited, and conventional deposition techniques may be utilized to form the barrier layer 35 and wiring layer 38. For example, the barrier layer 35 and the wiring layer 38 may be formed by a sputtering process, a CVD process, an atomic layer deposition (ALD) process, an HDP-CVD process, a vacuum evaporation process, a pulsed laser deposition (PLD) process, etc.

Figure 2C:
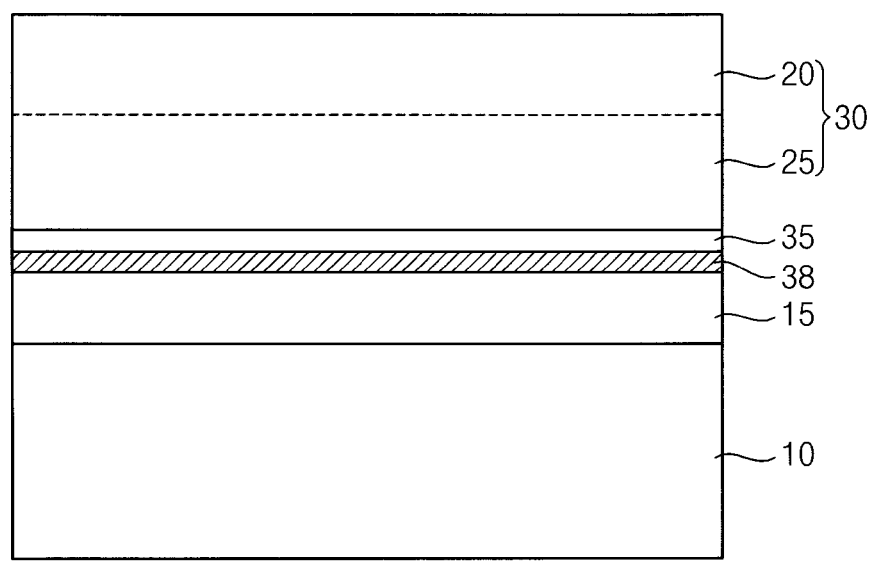

Referring now to FIG. 2C, the first substrate 10 is attached (bonded) to the second substrate 30 such that the wiring layer 38 (conductive wiring layer 40) is sandwiched between the insulating layer 15 and the barrier layer 35. That is, the exposed surface of the insulating layer 15 is attached to the exposed surface of the wiring layer 38. The method of attachment is not limited, and examples may include attachment by a heat treatment, an adhesion layer, a plasma treatment and/or an ultra violet (UV) treatment.

In another example embodiment, an adhesion layer may be interposed between the insulating layer 15 and the barrier layer 35 to improve the adhesion strength between the first substrate 10 and the second substrate 30.

After attachment of the first and the second substrates 10 and 30, the sacrificial layer 20 of the second substrate 30 is removed to result in the substrate structure of FIG. 1 described above. The method of removal is not limited, and examples of removal techniques may include laser cutting, grinding, chemical-mechanical polishing (CMP) and/or etching.

The inclusion of the sacrificial layer 20 is effective to add additional strength and/or rigidity to the second substrate 30 during the bonding process. Then, by removing the sacrificial layer 20 after bonding, an overall thickness of the substrate structure is reduced.

Figure 3:
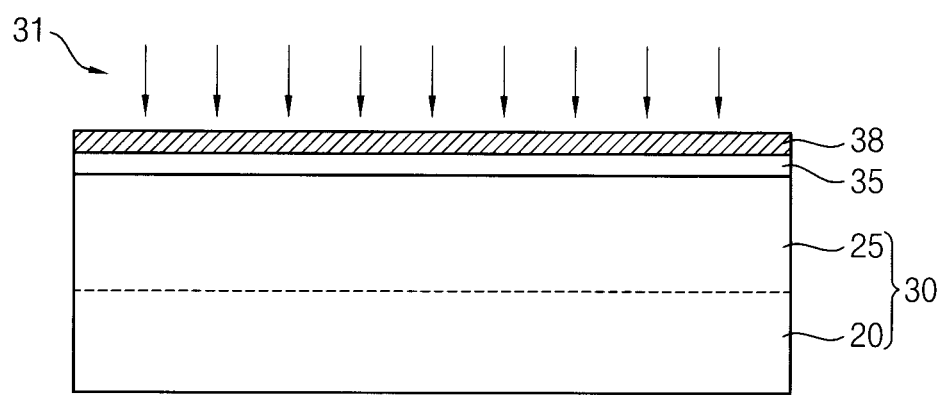

FIG. 3 is a cross-sectional diagram for use in describing an alternative method of forming the second substrate 30. In this example embodiment, the sacrificial layer 20 is defined within the second substrate 30 by ion implantation 31 (e.g. hydrogen ion ($H^+$) implantation) to a depth within the substrate 30, where the depth defines an interface between the sacrificial layer 20 and the semiconductor layer 25. The ion implantation 31 may create a lattice defect characterized by weak atomic coherence, and the lattice defect may facilitate removal of the sacrificial layer 20 by cleaving. The second substrate 30 may be planarized to have a level surface after removing the sacrificial layer 20 from the second substrate 30.

Another embodiment of the inventive concepts will now be described with reference to the cross-sectional view of FIG. 4. In particular, FIG. 4 is a cross-sectional view of a substrate structure including a buried wiring according to another embodiment of the inventive concepts.

Figure 4:
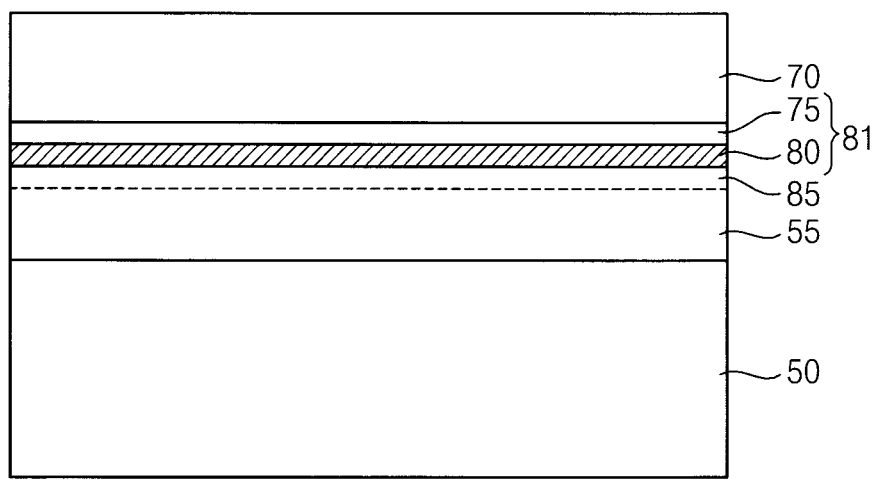
FIG. 4 is a cross-sectional view of a substrate structure according to an embodiment of the inventive concepts.

Referring to FIG. 4, the substrate structure of this example includes a first substrate 50 and a second substrate 70. Examples of the first substrate 50 and the second substrate 70 may include a silicon substrate, a germanium substrate, a silicon-germanium substrate, a SOI substrate, a GOI substrate, and a metal oxide substrate such as an aluminum oxide substrate. The first and the second substrates 50 and 70 may be formed of the same substrate material or different substrate materials.

In the example of this embodiment, a first insulating layer 55, a second insulating layer 85 and a buried wiring 81 are stacked between the first and the second substrates 50 and 70 as shown in FIG. 4. In the example of this embodiment, the buried wiring 81 includes a barrier layer 75 and a conductive wiring layer 80. In an alternative embodiment, the barrier layer 75 may be omitted, and the buried wiring 81 may be defined by the conductive wiring layer 80.

Material examples of the first and the second insulating layers 55 and 85 may include oxides, such as silicon oxides, and other dielectric materials. For example, each of the first and the second insulating layers 55 and 85 may include HDP-CVD oxide, PSG, USG, FOX, BPSG, SOG, BSG, PSG, TEOS, PE-TEOS, FSG, TOSZ®, etc. The first and the second insulating layers 55 and 85 may be formed of the same oxide or different oxides.

Material examples of the conductive wiring layer 80 may include doped polysilicon, W, Ti, Ta, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, $ZrN_x$, and combinations of any one or more of these.

Material examples of the barrier layer 75 may include Ti, $TiN_x$, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, $CoSi_x$, and combinations of two or more of these.

In the example of the illustrated embodiment, an upper surface of the buried wiring 81 may directly contact the second substrate 70. That is, in the illustrated example embodiment, an upper surface of the barrier layer 75 directly contacts a lower surface of the second substrate 70. However, as mentioned above, an alternative embodiment is where all or part of the barrier layer 75 may be omitted. In this case, all or part of an upper surface of the conductive wiring layer 80 may directly contact the second substrate 70.

A method of fabricating the substrate structure of FIG. 4 will now be described with reference to the cross-sectional views of FIG. 5A through FIG. 5C.

Figure 5A:
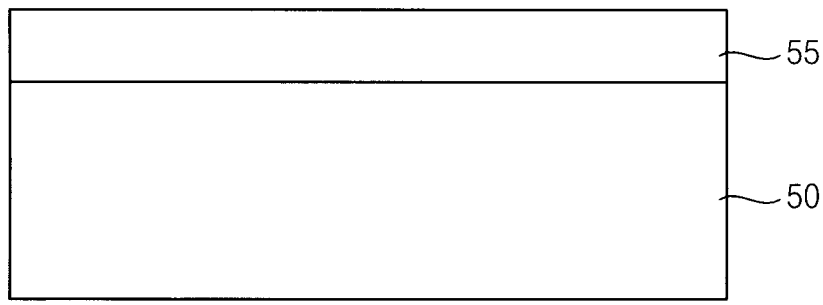
FIGS. 5A through 5C are cross-sectional views for use in explaining a method of fabricating the substrate structure of FIG. 4 according to an embodiment of the inventive concepts.

Referring to FIG. 5A, a first insulating layer 55 is formed on a surface of a first substrate 50. The method of formation is not limited, and conventional deposition techniques nay be utilized to form the first insulating layer 55. For example, the first insulating layer 55 may be formed by a thermal oxidation process, a radical oxidation process, a CVD process, a PECVD process, a spin coating process, an HDP-CVD process, etc.

Figure 5B:
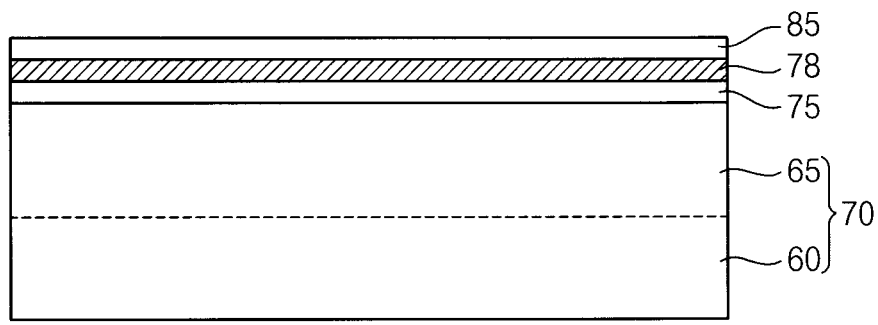

Referring next to FIG. 5B, a second substrate 70 is provided which includes a semiconductor layer 65 and a sacrificial layer 60. The second substrate 70 may be formed of a single contiguous material, in which case the semiconductor layer 65 and the sacrificial layer 60 may be formed of the same material. In this case, the sacrificial layer 60 simply defines a portion of the second substrate 70 that is to be later removed. Alternatively, the sacrificial layer 60 may constitute a different material layer than the semiconductor layer 65. Further, the sacrificial layer 60 may be defined using the same ion implantation technique discussed above in connection with FIG. 3.

Still referring to FIG. 5B, a barrier layer 75 is formed on a surface of the second substrate 70 opposite the sacrificial layer 60, and a wiring layer 78 (which forms the conductive wiring layer 80 of the fabricated substrate structure) is formed on the surface of the barrier layer 75. Here, the methods of formation are not limited, and conventional deposition techniques may be utilized to form the barrier layer 75 and wiring layer 78. For example, the barrier layer 75 and the wiring layer 78 may be formed by a sputtering process, a CVD process, an ALD process, a PECVD process, a PLD process, a vacuum evaporation process, etc.

Still referring to FIG. 5B, a second insulating layer 85 is formed on a surface of the wiring layer 78. The method of formation is not limited, and conventional deposition techniques may be utilized to form the second insulating layer 85. For example, the second insulating layer 85 may be formed by a thermal oxidation process, a radical oxidation process, a CVD process, a PECVD process, a spin coating process, an HDP-CVD process, etc.

Figure 5C:
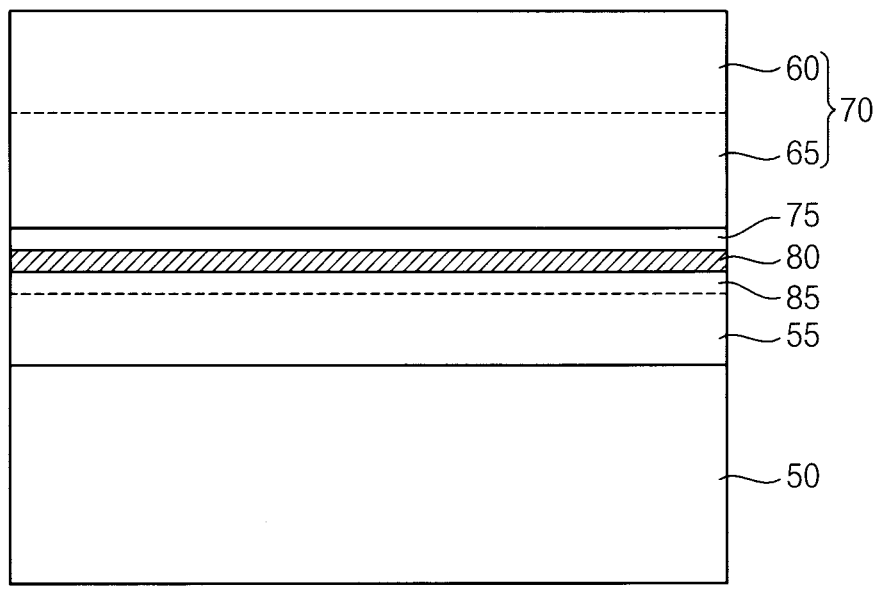

Referring now to FIG. 5C, the first substrate 50 is attached (bonded) to the second substrate 70 such that the wiring layer 78 (conductive wiring layer 80) is sandwiched between the barrier layer 75 and the second insulating layer 85. That is, the exposed surface of the first insulating layer 55 is attached to the exposed surface of the second insulating layer 85. The method of attachment is not limited, and examples may include attachment by a heat treatment, an adhesion layer, a plasma treatment and/or a UV treatment. The first substrate 50 is combined with the second substrate 70 by attaching the first insulating layer 55 with the second insulating layer 85, such that the adhesion strength between the first and the second substrates 50 and 70 may be more increased.

In another example embodiment, a cleaning process may be performed about the first insulating layer 55 and/or the second insulating layer 85 to remove impurities and/or a native oxide film from the first insulating layer 55 and/or the second insulating layer 85.

After attachment of the first and the second substrates 50 and 70, the sacrificial layer 60 of the second substrate 70 is removed to result in the substrate structure of FIG. 4 described above. The method of removal is not limited, and examples of removal techniques may include laser cutting, grinding, CMP and/or etching. The sacrificial layer 60 may also be removed by cleaving, particularly in the case where the sacrificial layer 60 is defined using the ion implantation technique discussed above in connection with FIG. 3.

The inclusion of the sacrificial layer 60 is effective to add additional strength and/or rigidity to the second substrate 70 during the bonding process. Then, by removing the sacrificial layer 60 after bonding, an overall thickness of the substrate structure is reduced.

Figure 6:
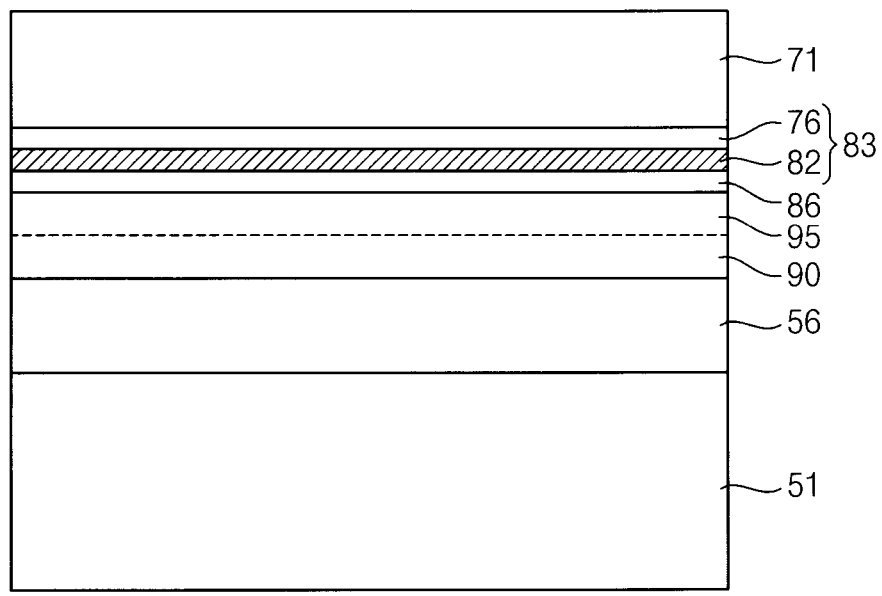
FIG. 6 is a cross-sectional view of a substrate structure according to an embodiment of the inventive concepts.

Another embodiment of the inventive concept will now be described with reference to the cross-sectional view of FIG. 6. FIG. 6 is a cross-sectional view of a substrate structure including a buried wiring according to another embodiment of the inventive concepts.

Referring to FIG. 6, the substrate structure of this example includes a first substrate 51 and a second substrate 71. Examples of the first substrate 51 and the second substrate 71 may include a silicon substrate, a germanium substrate, a silicon-germanium substrate, a SOI substrate, a GOI substrate, and a metal oxide substrate such as an aluminum oxide substrate. The first and the second substrates 51 and 71 may be formed of the same substrate material or different substrate materials.

In the example of this embodiment, a first insulating layer 56, a first adhesion layer 90, a second adhesion layer 95, a second insulating layer 86 and a buried wiring 83 are stacked between the first and the second substrates 51 and 71 as shown in FIG. 6. In the example of this embodiment, the buried wiring 83 includes a barrier layer 76 and a conductive wiring layer 82. In an alternative embodiment, the barrier layer 76 may be omitted, and the buried wiring 83 may be defined by the conductive wiring layer 82.

Material examples of the first and the second insulating layers 56 and 86 may include oxides, such as silicon oxides, and other dielectric materials. For example, each of the first and the second insulating layers 56 and 86 may include HDP-CVD oxide, PSG, USG, FOX, BPSG, SOG, BSG, PSG, TEOS, PE-TEOS, FSG, TOSZ®, etc. The first and the second insulating layers 56 and 86 may be formed of the same oxide or different oxides.

The first and the second adhesion layers 90 and 95 positioned between the first insulating layer 56 and the second insulating layer 86. Materials of the first and the second adhesion layers 90 and 95 may include silicon oxides, silicon nitrides, silicon oxynitrides, etc. The first and the second adhesion layers 90 and 95 may be formed of the same substrate material or different substrate materials. The first and the second adhesion layers 90 and 95 may more improve the adhesion strength between the first substrate 51 and the second substrate 71.

Material examples of the conductive wiring layer 82 may include doped polysilicon, W, Ti, Ta, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, $ZrN_x$, and combinations of any one or more of these. Material examples of the barrier layer 76 may include Ti, $TiN_x$, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, $CoSi_x$, and combinations of two or more of these.

In the example of the illustrated embodiment, an upper surface of the buried wiring 83 may directly contact the second substrate 71. That is, in the illustrated example embodiment, an upper surface of the barrier layer 76 directly contacts a lower surface of the second substrate 71. However, as mentioned above, an alternative embodiment is where all or part of the barrier layer 76 may be omitted. In this case, all or part of an upper surface of the conductive wiring layer 82 may directly contact the second substrate 71.

A method of fabricating the substrate structure of FIG. 6 will now be described with reference to the cross-sectional views of FIG. 7A and FIG. 7B.

Figure 7A:
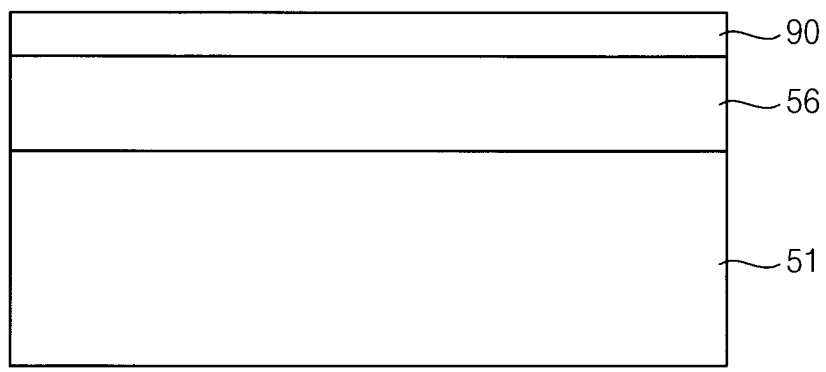
FIGS. 7A and 7B are cross-sectional views for use in explaining a method of fabricating the substrate structure of FIG. 6 according to an embodiment of the inventive concepts.

Referring to FIG. 7A, a first insulating layer 56 is formed on a surface of a first substrate 51. The method of formation is not limited, and conventional deposition techniques nay be utilized to form the first insulating layer 56. For example, the first insulating layer 56 may be formed by a thermal oxidation process, a radical oxidation process, a CVD process, a PECVD process, a spin coating process, an HDP-CVD process, etc.

A first adhesion layer 90 is formed on the first insulating layer 56. The method of formation is not limited, and conventional deposition techniques nay be utilized to form the first adhesion layer 90. For example, the first adhesion layer 90 may be formed by a CVD process, a PECVD process, a low pressure CVD (LPCVD) process, etc.

Figure 7B:
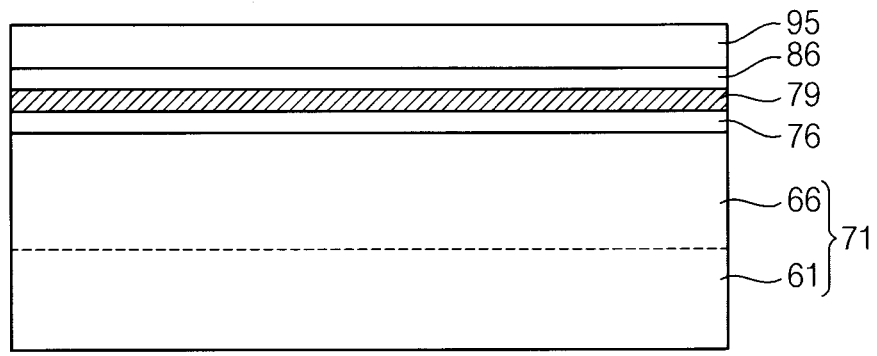

Referring next to FIG. 7B, a second substrate 71 is provided which includes a semiconductor layer 66 and a sacrificial layer 61. The second substrate 71 may be formed of a single contiguous material, in which case the semiconductor layer 66 and the sacrificial layer 61 may be formed of the same material. In this case, the sacrificial layer 61 simply defines a portion of the second substrate 71 that is to be later removed. Alternatively, the sacrificial layer 61 may constitute a different material layer than the semiconductor layer 66. Further, the sacrificial layer 61 may be defined using the same ion implantation technique discussed above in connection with FIG. 3.

Still referring to FIG. 7B, a barrier layer 76 is formed on a surface of the second substrate 71 opposite the sacrificial layer 61, and a wiring layer 79 (which forms the conductive wiring layer 82 of the fabricated substrate structure) is formed on the surface of the barrier layer 76. Here, the methods of formation are not limited, and conventional deposition techniques may be utilized to form the barrier layer 76 and wiring layer 79. For example, the barrier layer 76 and the wiring layer 79 may be formed by a sputtering process, a CVD process, an ALD process, a PECVD process, a PLD process, a vacuum evaporation process, etc.

Still referring to FIG. 7B, a second insulating layer 86 is formed on a surface of the wiring layer 79. The method of formation is not limited, and conventional deposition techniques may be utilized to form the second insulating layer 86. For example, the second insulating layer 86 may be formed by a thermal oxidation process, a radical oxidation process, a CVD process, a PECVD process, a spin coating process, an HDP-CVD process, etc.

A second adhesion layer 95 is formed on the second insulating layer 86. The method of formation is not limited, and conventional deposition techniques may be utilized to form the second adhesion layer 95. For example, the second adhesion layer 95 may be formed by a CVD process, a PECVD process, an LPCVD process, etc.

The first substrate 51 is attached (bonded) to the second substrate 71 such that the wiring layer 79 (conductive wiring layer 82 of FIG. 6) is sandwiched between the barrier layer 76 and the second insulating layer 86. That is, the exposed surface of the first adhesion layer 90 is attached to the exposed surface of the second adhesion layer 95. The method of attachment is not limited, and examples may include attachment by a heat treatment, an adhesion layer, a plasma treatment and/or a UV treatment. The first substrate 51 is combined with the second substrate 71 by attaching the first adhesion layer 90 with the second adhesion layer 95, such that the adhesion strength between the first and the second substrates 51 and 71 may be considerably increased.

In another example embodiment, a cleaning process may be performed about the first adhesion layer 90 and/or the second adhesion layer 95 to remove impurities and/or a native oxide film from the first adhesion layer 90 and/or the second adhesion layer 95.

After attachment of the first and the second substrates 51 and 71, the sacrificial layer 61 of the second substrate 71 is removed to result in the substrate structure of FIG. 6 described above. The method of removal is not limited, and examples of removal techniques may include laser cutting, grinding, CMP and/or etching. The sacrificial layer 61 may also be removed by cleaving, particularly in the case where the sacrificial layer 61 is defined using the ion implantation technique discussed above in connection with FIG. 3.

The inclusion of the sacrificial layer 61 is effective to add additional strength and/or rigidity to the second substrate 71 during the bonding process. Then, by removing the sacrificial layer 61 after bonding, an overall thickness of the substrate structure is reduced.

Figure 8:
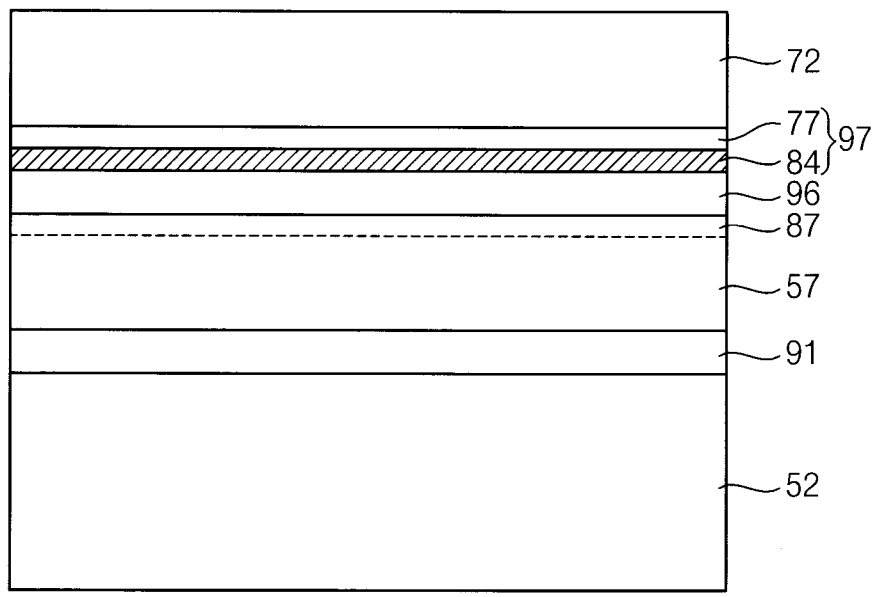
FIG. 8 is a cross-sectional view of a substrate structure according to an embodiment of the inventive concepts.

Another embodiment of the inventive concept will now be described with reference to the cross-sectional view of FIG. 8. FIG. 8 is a cross-sectional view of a substrate structure including a buried wiring according to another embodiment of the inventive concepts.

Referring to FIG. 8, the substrate structure of this example includes a first substrate 52 and a second substrate 72. Examples of the first substrate 52 and the second substrate 72 may include a silicon substrate, a germanium substrate, a silicon-germanium substrate, a SOI substrate, a GOI substrate, and a metal oxide substrate such as an aluminum oxide substrate. The first and the second substrates 52 and 72 may be formed of the same substrate material or different substrate materials.

In the example of this embodiment, a first adhesion layer 91, a first insulating layer 57, a second insulating layer 87, a second adhesion layer 95 and a buried wiring 97 are stacked between the first and the second substrates 52 and 72 as shown in FIG. 8. In the example of this embodiment, the buried wiring 97 includes a barrier layer 77 and a conductive wiring layer 84. In an alternative embodiment, the barrier layer 77 may be omitted, and the buried wiring 97 may be defined by the conductive wiring layer 84.

The first adhesion layer 91 is disposed between the first substrate 51 and the first insulating layer 57. Materials of the first adhesion layers 91 may include silicon oxide, silicon nitride, silicon oxynitride, etc.

The first and the second insulating layers 57 and 87 are stacked on the first adhesion layer 91. Material examples of the first and the second insulating layers 57 and 87 may include oxides, such as silicon oxides, and other dielectric materials. The first and the second insulating layers 57 and 87 may be formed of the same oxide or different oxides.

The second adhesion layer 96 is positioned between the second insulating layer 87 and the buried wiring 97. Materials of the second adhesion layers 96 may include silicon oxide, silicon nitride, silicon oxynitride, etc. The first and the second adhesion layers 91 and 96 may be formed of the same substrate material or different substrate materials. The first and the second adhesion layers 91 and 96 may greatly improve the adhesion strength between the first substrate 52 and the second substrate 72.

Material examples of the conductive wiring layer 84 may include doped polysilicon, W, Ti, Ta, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, $ZrN_x$, and combinations of any one or more of these. Material examples of the barrier layer 77 may include Ti, $TiN_x$, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, $CoSi_x$, and combinations of two or more of these.

In the example of the illustrated embodiment, an upper surface of the buried wiring 97 may directly contact the second substrate 72. That is, in the illustrated example embodiment, an upper surface of the barrier layer 77 directly contacts a lower surface of the second substrate 72. However, as mentioned above, an alternative embodiment is where all or part of the barrier layer 77 may be omitted. In this case, all or part of an upper surface of the conductive wiring layer 84 may directly contact the second substrate 72.

A method of fabricating the substrate structure of FIG. 8 will now be described with reference to the cross-sectional views of FIG. 9A and FIG. 9B.

Figure 9A:
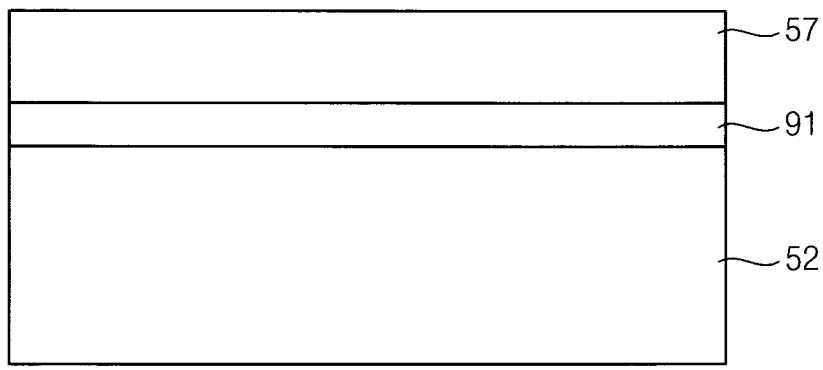
FIGS. 9A and 9B are cross-sectional views for use in explaining a method of fabricating the substrate structure of FIG. 8 according to an embodiment of the inventive concepts.

Referring to FIG. 9A, a first adhesion layer 91 is formed on a surface of a first substrate 52. The method of formation is not limited, and conventional deposition techniques nay be utilized to form the first adhesion layer 91. For example, the first adhesion layer 91 may be formed by a thermal oxidation process, a radical oxidation process, a CVD process, a PECVD process, a spin coating process, an LPCVD process, an HDP-CVD process, etc.

A first insulating layer 57 is formed on the first adhesion layer 91. The method of formation is not limited, and conventional deposition techniques nay be utilized to form the first insulating layer 91. For example, the first insulating layer 91 may be formed by a thermal oxidation process, a radical oxidation process, a CVD process, a PECVD process, a spin coating process, an HDP-CVD process, etc.

Figure 9B:
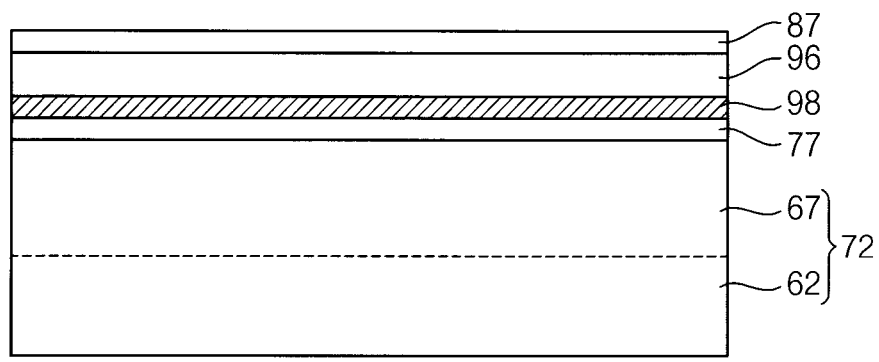

Referring next to FIG. 9B, a second substrate 72 is provided which includes a semiconductor layer 67 and a sacrificial layer 62. The second substrate 72 may be formed of a single contiguous material, in which case the semiconductor layer 67 and the sacrificial layer 62 may be formed of the same material. The sacrificial layer 62 simply defines a portion of the second substrate 72 that is to be later removed. Alternatively, the sacrificial layer 62 may constitute a different material layer than the semiconductor layer 67. Further, the sacrificial layer 62 may be defined using the same ion implantation technique discussed above in connection with FIG. 3.

Still referring to FIG. 9B, a barrier layer 77 is formed on a surface of the second substrate 72 opposite the sacrificial layer 62, and a wiring layer 98 (which forms the conductive wiring layer 84 of the fabricated substrate structure) is formed on the surface of the barrier layer 77. Here, the methods of formation are not limited, and conventional deposition techniques may be utilized to form the barrier layer 77 and wiring layer 98. For example, each of the barrier layer 77 and the wiring layer 98 may be formed by a sputtering process, a CVD process, an ALD process, a PECVD process, a PLD process, a vacuum evaporation process, etc.

Still referring to FIG. 9B, a second adhesion layer 96 is formed on a surface of the wiring layer 98. The method of formation is not limited, and conventional deposition techniques may be utilized to form the second adhesion layer 96. For example, the second adhesion layer 96 may be formed by a CVD process, a PECVD process, an LPCVD process, etc.

A second insulating layer 87 is formed on the second adhesion layer 96. The method of formation is not limited, and conventional deposition techniques may be utilized to form the second insulating layer 87. For example, the second insulating layer 87 may be formed by a thermal oxidation process, a radical oxidation process, a CVD process, a PECVD process, a spin coating process, an HDP-CVD process, etc.

The first substrate 52 is attached (bonded) to the second substrate 72 such that the wiring layer 98 (conductive wiring layer 84 of FIG. 8) is sandwiched between the barrier layer 77 and the second adhesion 96. That is, the exposed surface of the first insulating layer 57 is attached to the exposed surface of the second insulating layer 87. The method of attachment is not limited, and examples may include attachment by a heat treatment, an adhesion layer, a plasma treatment and/or a UV treatment. The first substrate 52 is combined with the second substrate 72 by attaching the first insulating layer 57 with the second insulating layer 97, such that the adhesion strength between the first and the second substrates 52 and 72 may be increased.

In another example embodiment, a cleaning process may be performed about the first insulating layer 57 and/or the second insulating layer 87 to remove impurities and/or a native oxide film from the first insulating layer 57 and/or the second insulating layer 87.

After attachment of the first and the second substrates 52 and 72, the sacrificial layer 62 of the second substrate 72 is removed to result in the substrate structure of FIG. 8 described above. The method of removal is not limited, and examples of removal techniques may include laser cutting, grinding, CMP and/or etching. The sacrificial layer 62 may also be removed by cleaving, particularly in the case where the sacrificial layer 62 is defined using the ion implantation technique discussed above in connection with FIG. 3.

The inclusion of the sacrificial layer 62 is effective to add additional strength and/or rigidity to the second substrate 72 during the bonding process. Then, by removing the sacrificial layer 62 after bonding, an overall thickness of the substrate structure is reduced.

Another embodiment of the inventive concepts will now be described with reference to the cross-sectional view of FIG. 10. In particular, FIG. 10 is a cross-sectional view of a substrate structure including a buried wiring according to another embodiment of the inventive concepts.

Figure 10:
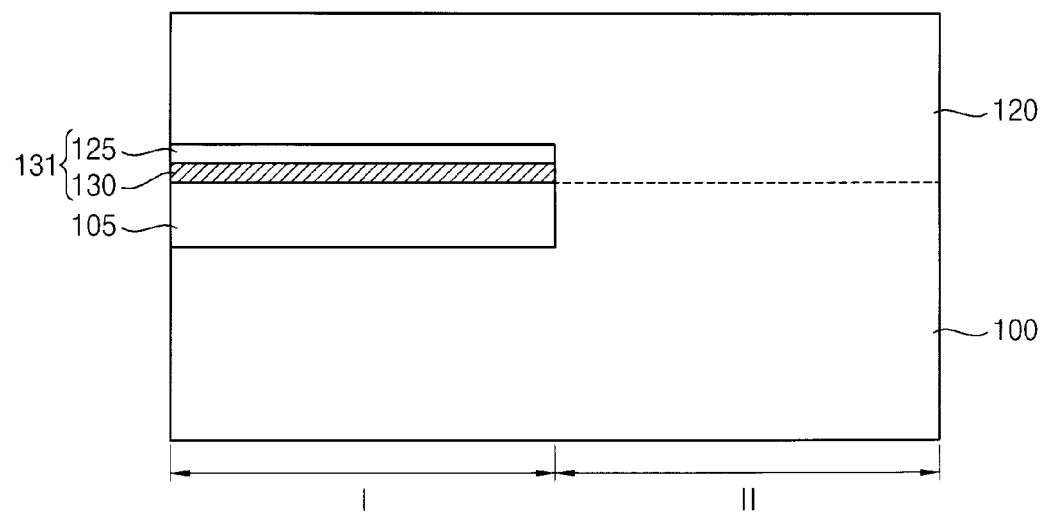
FIG. 10 is a cross-sectional view of a substrate structure according to an embodiment of the inventive concepts.

Referring to FIG. 10, the substrate structure of this example includes a first substrate 100 and a second substrate 120. Examples of the first substrate 100 and the second substrate 120 may include a silicon substrate, a germanium substrate, a silicon-germanium substrate, a SOI substrate, a GOI substrate, a metal oxide substrate, etc. The first and the second substrates 100 and 120 may be formed of the same substrate material or different substrate materials.

The substrate structure of FIG. 10 includes a first region I and a second region II. For example, the first region I may be a memory cell array region of a semiconductor memory device, and the second region II may be a peripheral circuit region of the semiconductor memory device.

In the example of this embodiment, an insulating layer 105 and a buried wiring 131 are stacked in the first region I between the first and the second substrates 100 and 120 as shown in FIG. 10. In the example of this embodiment, the buried wiring 131 includes a barrier layer 125 and a conductive wiring layer 130. In an alternative embodiment, the barrier layer 125 nay be omitted, and the buried wiring 131 may be defined by the conductive wiring layer 130.

Material examples of the insulating layer 105 may include oxides, such as silicon oxides, and other dielectric materials.

Material examples of the conductive wiring layer 130 may include doped polysilicon, W, Ti, $T_a$, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, $ZrN_x$, and combinations of any one or more of these.

Material examples of the barrier 125 may include Ti, $TiN_x$, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, $CoSi_x$, and combinations of two or more of these.

In the example of the illustrated embodiment, an upper surface of the buried wiring 131 may directly contact the second substrate 120. That is, in the illustrated example, an upper surface of the barrier layer 125 directly contacts a lower surface of the second substrate 120. However, as mentioned above, an alternative embodiment is where all or part of the barrier layer 125 may be omitted. In this case, all or part of an upper surface of the conductive wiring layer 130 may directly contact the second substrate 120.

Also in the example of this embodiment, the first and the second substrates 100 and 120 directly contact each other in the second region II. In examples of alternative embodiments, however, one or more insulating layers may extend between the first and the second substrates 100 and 120 and/or between the insulating layer 105 and the buried wiring 131.

A method of fabricating the substrate structure of FIG. 10 will now be described with reference to the cross-sectional views of FIG. 11A through FIG. 11G.

Figure 11A:
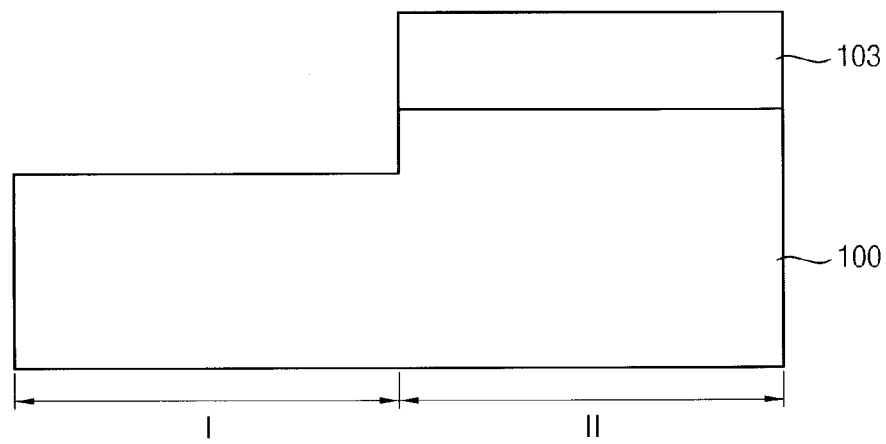
FIGS. 11A through 11G and FIG. 12 are cross-sectional views for use in explaining a method of fabricating the substrate structure of FIG. 10 according to an embodiment of the inventive concepts.

Referring to FIG. 11A, a first mask pattern 103 is formed over a first substrate 100, and a first recess is formed in a first region I of the first substrate 100 using the first mask pattern 103 as an etch mask.

Figure 11B:
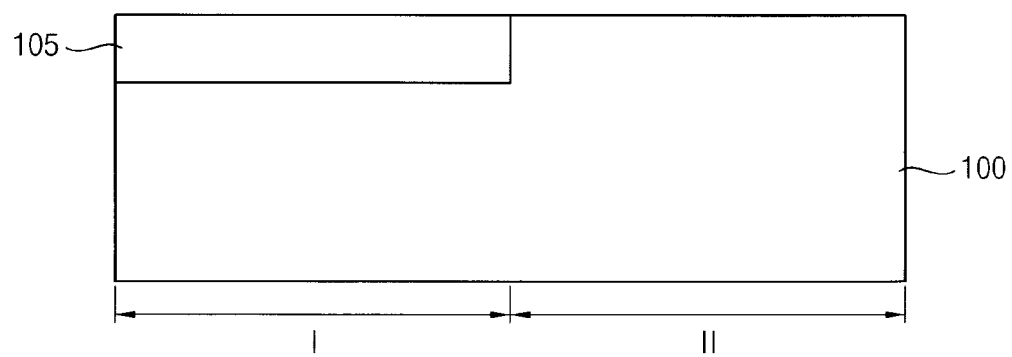

Next, referring to FIG. 11B, an insulating layer 105 is formed in the first recess of the first region I of the first substrate 100. This may be achieved, for example, by depositing an insulating material over an entire surface of the first substrate 100, and then removing the depositing insulating material until a top surface of a second region II of the first substrate 100 is exposed. The method of removal may include, for example, a CMP process and/or an etch-back process.

Figure 11C:
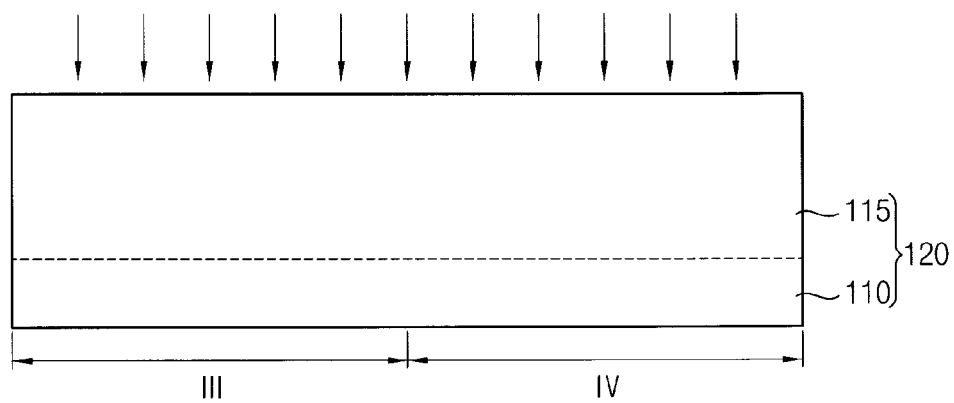

Referring to FIG. 11C, a second substrate 120 is provided which includes a semiconductor layer 115 and a sacrificial layer 110. The second substrate 120 may be formed of a single contiguous material, in which case the semiconductor layer 115 and the sacrificial layer 110 may be formed of the same material. In this case, the sacrificial layer 110 simply defines a portion of the second substrate 120 that is to be later removed. Alternatively, the sacrificial layer 110 may constitute a different material layer than the semiconductor layer 115. Further, the sacrificial layer 110 may be defined using the same ion implantation technique discussed above in connection with FIG. 3.

Figure 11D:
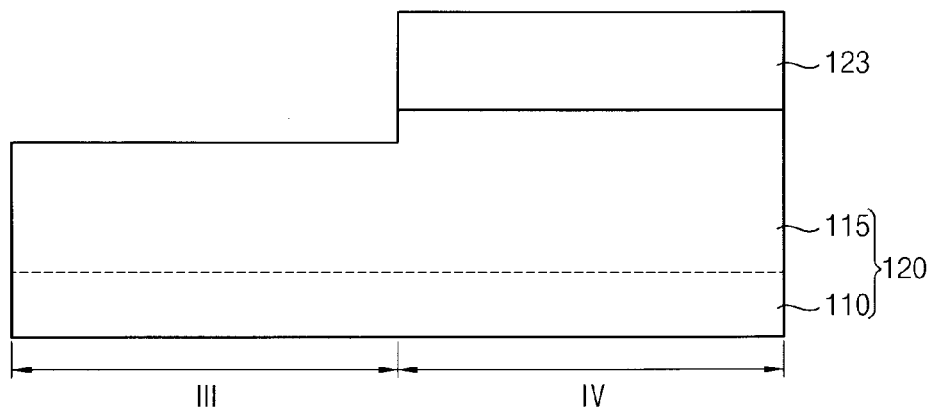

As shown in FIG. 11D, a second mask pattern 123 is formed over the second substrate 120 having a first region III and a second region IV, and a second recess is formed in the first region III of the second substrate 120 using the second mask pattern 123 as an etch mask. The second recess may, for example, have the same dimensions (parallel to the surface of the second substrate 120) as the first recess formed in the first region I of the first substrate 100.

Figure 11E:
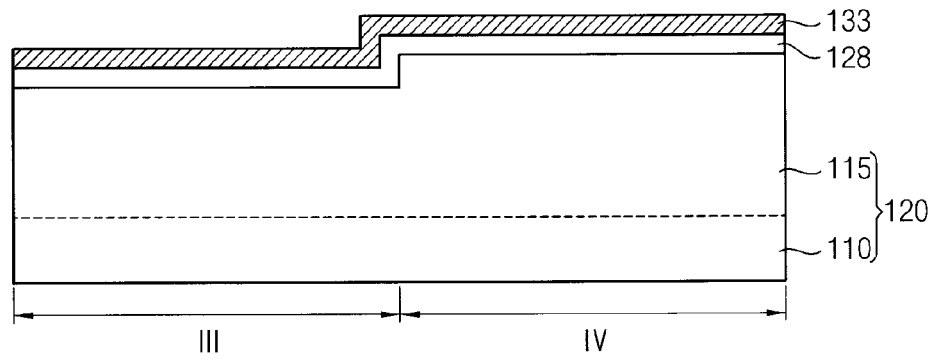

Referring now to FIG. 11E, the second mask pattern 123 (see FIG. 11D) is removed, and a preliminary barrier layer 128 and a preliminary conductive layer 133 are sequentially formed over an entire surface of the second substrate 120. The method of forming the preliminary layers 128 and 133 is not limited, and conventional deposition techniques may be utilized.

Figure 11F:
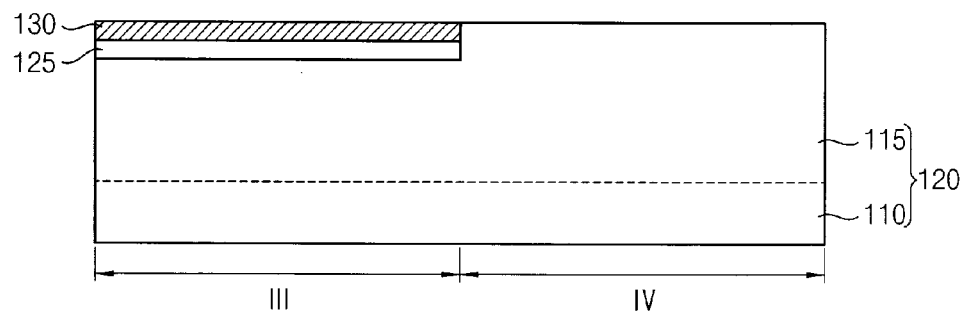

As shown in FIG. 11F, the preliminary barrier layer 128 and the preliminary conductive layer 133 (see FIG. 11E) are partially removed to define a barrier layer 125 and a conductive wiring layer 130 within the second recess of the second substrate 120. The method of removal may include, for example, a CMP process and/or an etch-back process which is (are) executed until an upper surface of a second region IV of the second substrate 120 is exposed.

Figure 11G:
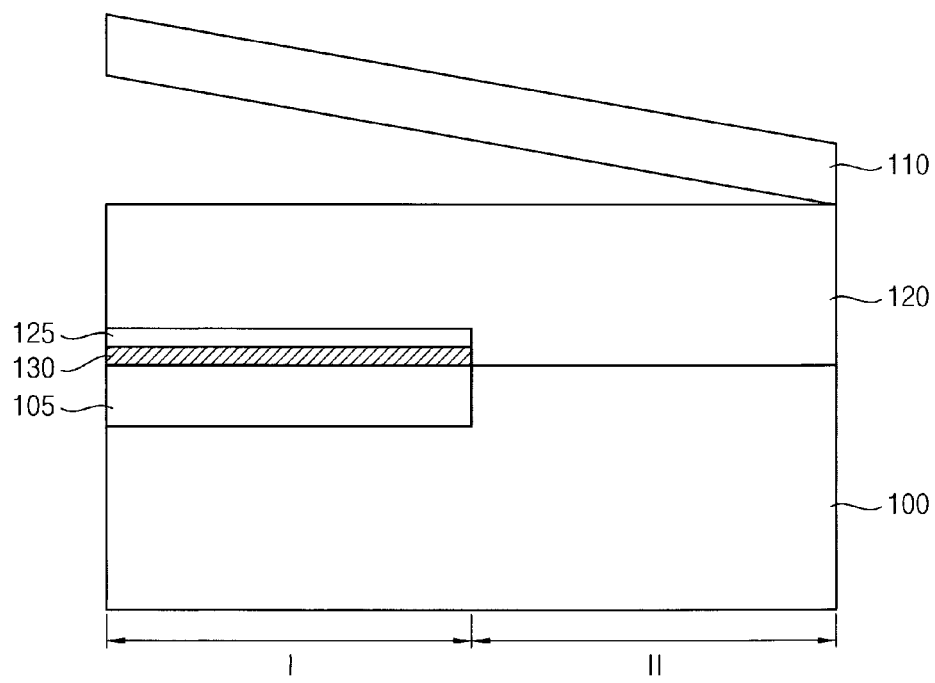

Referring now to FIG. 11G, the first substrate 100 is attached (bonded) to the second substrate 120 such that the first and the second recesses of the first and the second substrates 100 and 120 are aligned, namely, such that the conductive wiring layer 130 is sandwiched between the barrier layer 125 and the insulating layer 105. That is, the exposed surfaces of the insulating layer 105 and the first substrate 100 are attached to the exposed surfaces of the conductive wiring layer 130 and the second substrate 120, respectively. The method of attachment is not limited, and examples may include attachment by a heat treatment, an adhesion layer, a plasma treatment and/or a UV treatment.

Still referring to FIG. 11G, after attachment of the first and the second substrates 110 and 120, the sacrificial layer 110 of the second substrate 120 is removed to result in the substrate structure of FIG. 10 described above. The method of removal is not limited, and examples of removal techniques may include laser cutting, grinding, CMP and/or etching. The sacrificial layer 110 may also be removed by cleaving, particularly in the case where the sacrificial layer 110 may be defined using the ion implantation technique discussed above in connection with FIG. 3.

Like the initial embodiment, the inclusion of the sacrificial layer 110 is effective to add additional strength and/or rigidity to the second substrate 120 during the bonding process. Then, by removing the sacrificial layer 110 after bonding, an overall thickness of the substrate structure is reduced.

Figure 12:
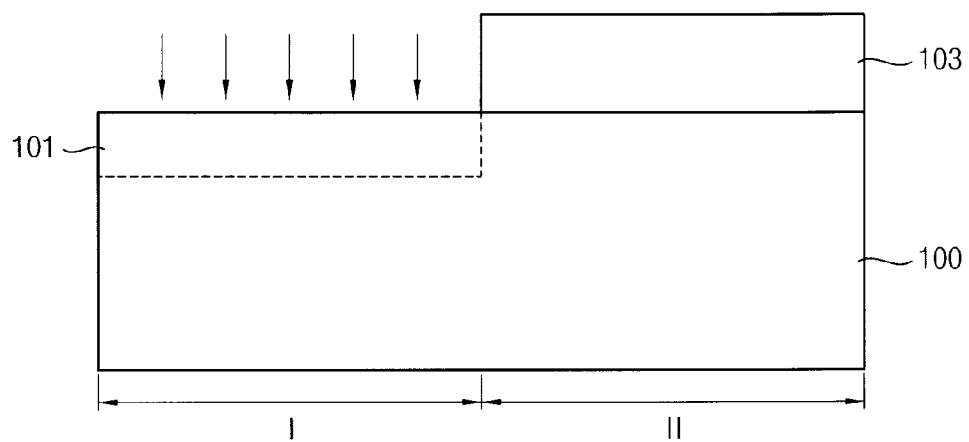

FIG. 12 is a cross-sectional view for describing an alternative technique for forming the insulating layer (105 in FIG. 11B) in the first substrate 100. In this embodiment, a mask pattern 103 is formed to expose the second region II of the first substrate 100, and then a defect region is formed by ion implantation 31 (e.g. $H^+$ ion implantation) to a depth within the first region I of the first substrate 100. Here, the mask pattern 103 functions as an implantation mask. The resultant defect region 101 may exhibit weak atomic coherence, making it easily susceptible to oxidation. An oxidation process is then carried out to oxidize the defect region 101, thereby defining the insulating layer 105. The method of oxidation is not limited, and convention oxidation techniques may be utilized here.

Another embodiment of the inventive concepts will now be described with reference to the cross-sectional view of FIG. 13. In particular, FIG. 13 is a cross-sectional view of a substrate structure including a buried wiring according to another embodiment of the inventive concepts.

Figure 13:
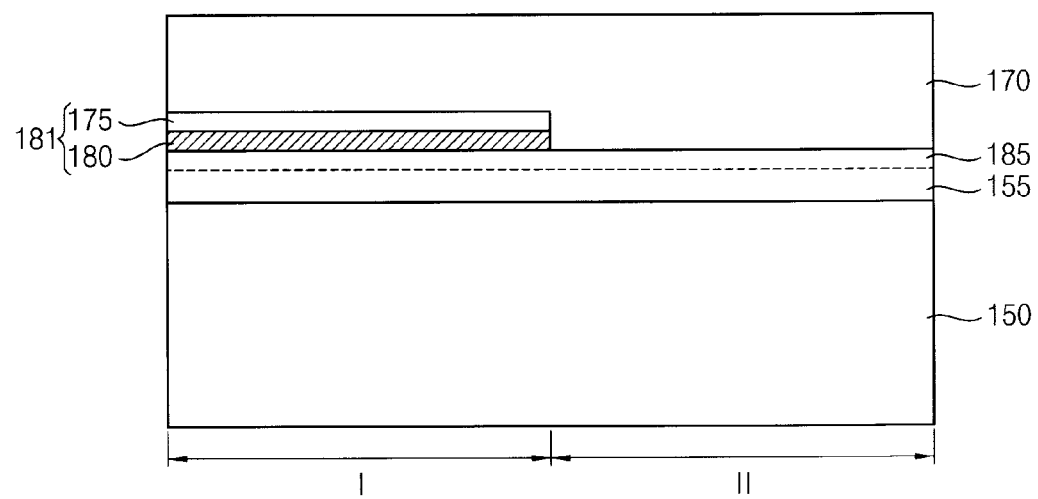
FIG. 13 is a cross-sectional view of a substrate structure according to an embodiment of the inventive concepts.

Referring to FIG. 13, the substrate structure of this example includes a first substrate 150 and a second substrate 170. Examples of the first substrate 150 and the second substrate 170 may include a silicon substrate, a germanium substrate, a silicon-germanium substrate, a SOI substrate, a GOI substrate, a metal oxide substrate, etc. The first and the second substrates 150 and 170 may be formed of the same substrate material or different substrate materials.

The substrate structure of FIG. 13 includes a first region I and a second region II. For example, the first region I may be a memory cell array region of a semiconductor memory device, and the second region II may be a peripheral circuit region of the semiconductor memory device.

In the example of this embodiment, first and second insulating layers 155 and 185 are stacked between the substrates 150 and 170 in both the first region I and second region II. Further, a buried wiring 181 is stacked over the second insulating layer 185 in the first region I between the first and the second substrates 150 and 170 as shown in FIG. 13. In the example of this embodiment, the buried wiring 181 includes a barrier layer 175 and a conductive wiring layer 180. In an alternative embodiment, the barrier layer 175 may be omitted, and the buried wiring 181 may be defined by the conductive wiring layer 180.

Material examples of the first and the second insulating layers 155 and 185 may include oxides, such as silicon oxides, and other dielectric materials. Further, the first and the second insulating layers 155 and 185 may be formed of the same or different materials.

Material examples of the conductive wiring layer 180 may include doped polysilicon, W, Ti, Ta, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, $ZrN_x$, and combinations of any one or more of these.

Material examples of the barrier layer 175 may include Ti, $TiN_x$, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, $CoSi_x$, and combinations of two or more of these.

In the example of the illustrated embodiment, an upper surface of the buried wiring 181 directly contacts the second substrate 170. That is, in the illustrated example, an upper surface of the barrier layer 175 may directly contact a lower surface of the second substrate 170. However, as mentioned above, an alternative embodiment is where all or part of the barrier layer 175 may be omitted. In this case, all or part of an upper surface of the conductive wiring layer 180 may directly contact the second substrate 170.

A method of fabricating the substrate structure of FIG. 13 will now be described with reference to the cross-sectional views of FIG. 14A through FIG. 14C.

Figure 14A:
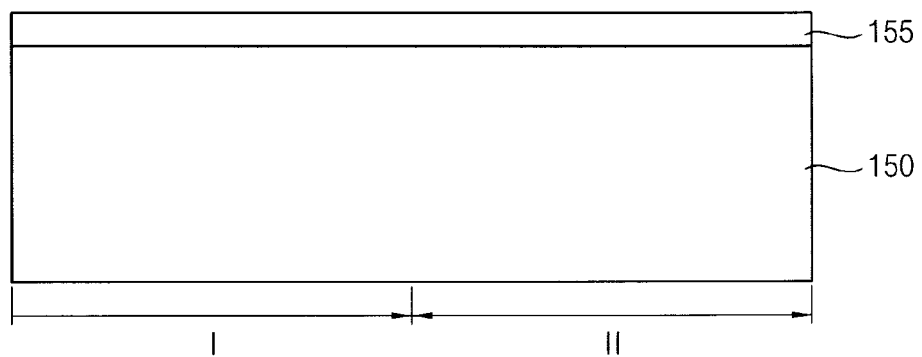
FIGS. 14A through 14C are cross-sectional views for use in explaining a method of fabricating the substrate structure of FIG. 13 according to an embodiment of the inventive concepts.

Referring to FIG. 14A, a first insulating layer 155 is formed on a surface of a first substrate 150 so as to extend over both regions I and II of the first substrate 150. The method of forming the first insulating layer 155 is not limited, and conventional deposition techniques may be utilized.

Figure 14B:
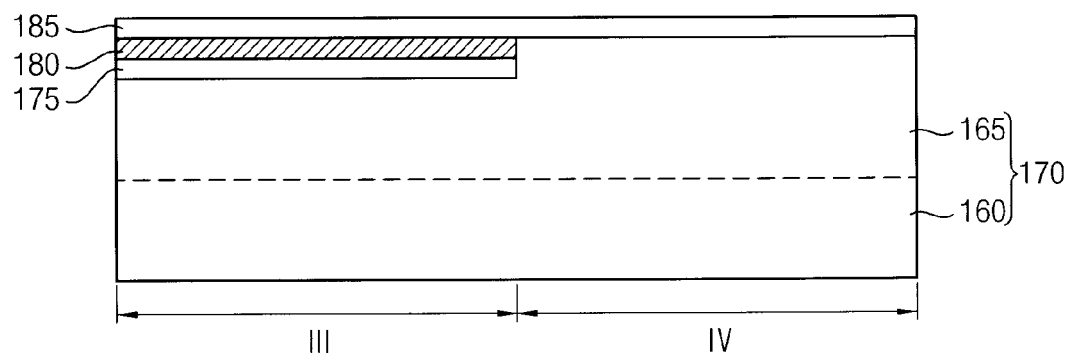

Referring to FIG. 14B, a second substrate 170 is provided which includes a semiconductor layer 165 and a sacrificial layer 160. The second substrate 170 may be formed of a single contiguous material, in which case the semiconductor layer 165 and sacrificial layer 160 may be formed of the same material. In this case, the sacrificial layer 160 simply defines a portion of the second substrate 170 that is to be later removed. Alternatively, the sacrificial layer 160 may constitute a different material layer than the semiconductor layer 165. Further, the sacrificial layer 160 may be defined using the same ion implantation technique discussed above in connection with FIG. 3.

Still referring to FIG. 14B, a recess is formed in a region III of the second substrate 170, and a barrier layer 175 and conductive wiring layer 180 are formed in the recess. This may be accomplished, for example, using the processes described above in connection with FIGS. 11D through 11F. A second insulating layer 185 is then formed over regions III and IV of the second substrate 170 as shown in FIG. 14B. The method of forming the second insulating layer 185 is not limited, and conventional deposition techniques may be utilized.

Figure 14C:
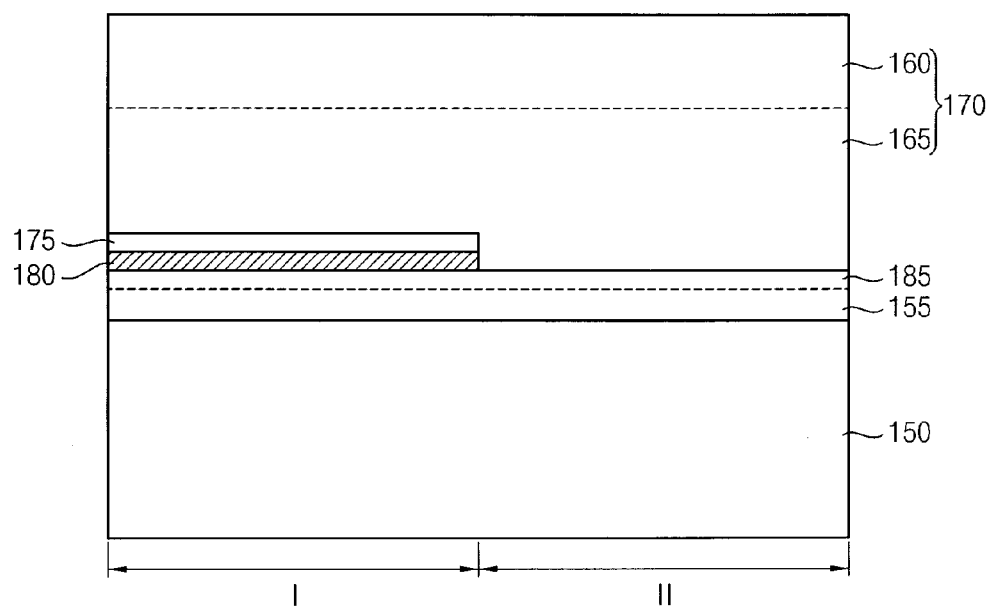

Referring now to FIG. 14C, the first substrate 150 is attached (bonded) to the second substrate 170 such that the recess of the second substrate 170 is aligned with the region I of the first substrate 150. That is, the exposed surface of the first insulating layer 155 is attached to the exposed surface of the second insulating layer 185. The method of attachment is not limited, and examples may include attachment by a heat treatment, an adhesion layer, a plasma treatment and/or a UV treatment.

After attachment of the first and the second substrates 150 and 170, the sacrificial layer 160 of the second substrate 170 is removed to result in the substrate structure of FIG. 13 described above. The method of removal is not limited, and examples of removal techniques may include laser cutting, grinding, CMP and/or etching. The sacrificial layer 160 may also be removed by cleaving, particularly in the case where the sacrificial layer 160 may be defined using the ion implantation technique discussed above in connection with FIG. 3.

As with the prior embodiments, the inclusion of the sacrificial layer 160 is effective to add additional strength and/or rigidity to the second substrate 170 during the bonding process. Then, by removing the sacrificial layer 170 after bonding, an overall thickness of the substrate structure is reduced.

Another embodiment of the inventive concepts will now be described with reference to the cross-sectional view of FIG. 15. In particular, FIG. 15 is a cross-sectional view of a substrate structure including a buried wiring according to another embodiment of the inventive concepts.

Figure 15:
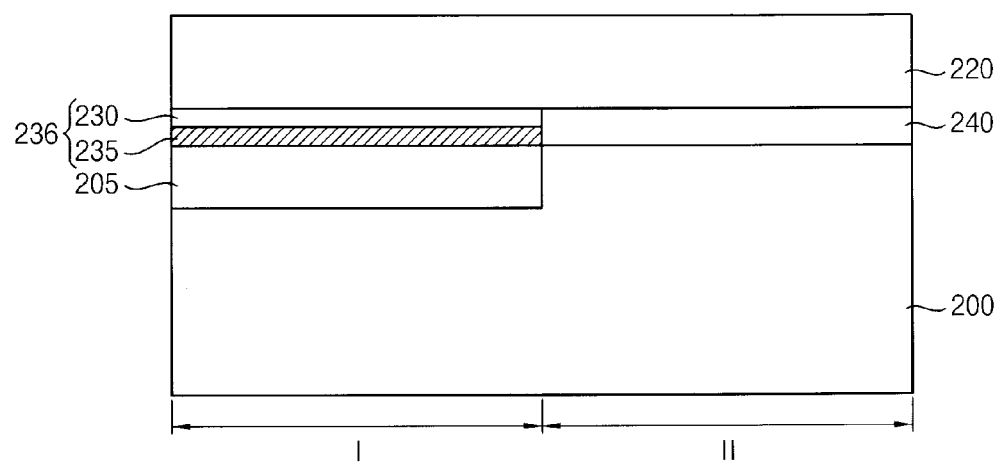
FIG. 15 is a cross-sectional view of a substrate structure according to an embodiment of the inventive concepts.

Referring to FIG. 15, the substrate structure of this example includes a first substrate 200 and a second substrate 220. Examples of the first substrate 200 and the second substrate 220 may include a silicon substrate, a germanium substrate, a silicon-germanium substrate, a SOI substrate, a GOI substrate, a metal oxide substrate, etc. The first and the second substrates 200 and 220 may be formed of the same substrate material or different substrate materials.

The substrate structure of FIG. 15 includes a first region I and a second region II. For example, the first region I may be a memory cell array region of a semiconductor memory device, and the second region II may be a peripheral circuit region of the semiconductor memory device.

In the example of this embodiment, an insulating layer 205 and a buried wiring 236 are stacked in the first region I between the first and the second substrates 200 and 220 as shown in FIG. 15. In the example of this embodiment, the buried wiring 236 includes a barrier layer 230 and a conductive wiring layer 235. In an alternative embodiment, the barrier layer 230 may be omitted, and the buried wiring 236 may be defined by the conductive wiring layer 235.

Material examples of the insulating layer 205 may include oxides, such as silicon oxides, and other dielectric materials.

Material examples of the conductive wiring layer 235 may include doped polysilicon, W, Ti, Ta, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, $ZrN_x$, and combinations of any one or more of these.

Material examples of the barrier layer 230 may include Ti, TiN, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, $CoSi_x$, and combinations of two or more of these.

In the example of the illustrated embodiment, an upper surface of the buried wiring 236 may directly contact the second substrate 220. That is, in the illustrated example, an upper surface of the barrier layer 230 directly contacts a lower surface of the second substrate 220. However, as mentioned above, an alternative embodiment is where all or part of the barrier layer 230 may be omitted. In this case, all or part of an upper surface of the conductive wiring layer 235 may directly contact the second substrate 220.

Also in the example of this embodiment, a compensation layer 240 is interposed at the second region II between the first and the second substrates 200 and 220. The compensation layer 240 may have a same thickness as the buried wiring 236, and may, for example, be formed of an undoped polysilicon and/or semiconductor material.

A method of fabricating the substrate structure of FIG. 15 will now be described with reference to the cross-sectional views of FIG. 16A through FIG. 16E.

Figure 16A:
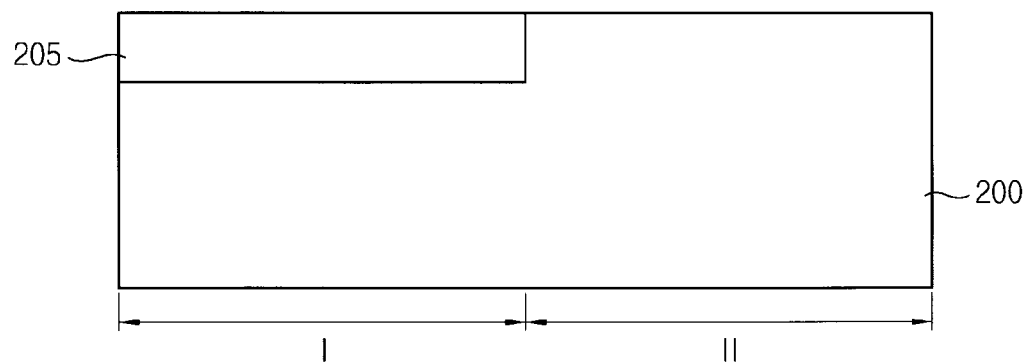
FIGS. 16A through 16E are cross-sectional views for use in explaining a method of fabricating the substrate structure of FIG. 15 according to an embodiment of the inventive concepts.

Referring to FIG. 16A, an insulating layer 205 is formed at a depth in a first region I of a first substrate 200. The insulating layer 205 may be formed, for example, using the techniques described above in connection with FIGS. 11A and 11B and FIG. 12.

Figure 16B:
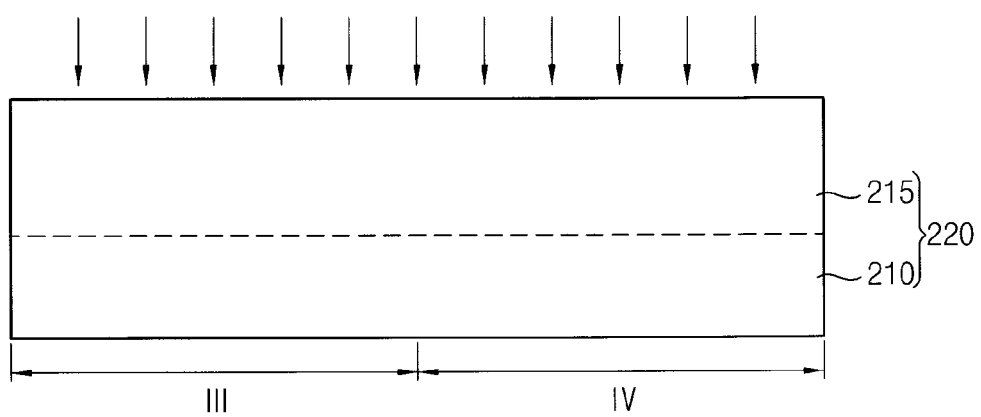

Referring to FIG. 16B, a second substrate 220 is provided which includes a semiconductor layer 215 and a sacrificial layer 210. The second substrate 220 may be formed of a single contiguous material, in which case the semiconductor layer 215 and the sacrificial layer 210 may be formed of the same material. In this case, the sacrificial layer 210 simply defines a portion of the second substrate 220 that is to be later removed. Alternatively, the sacrificial layer 210 may constitute a different material layer than the semiconductor layer 215. Further, the sacrificial layer 210 may be defined using the same ion implantation technique discussed above in connection with FIG. 3.

Figure 16C:
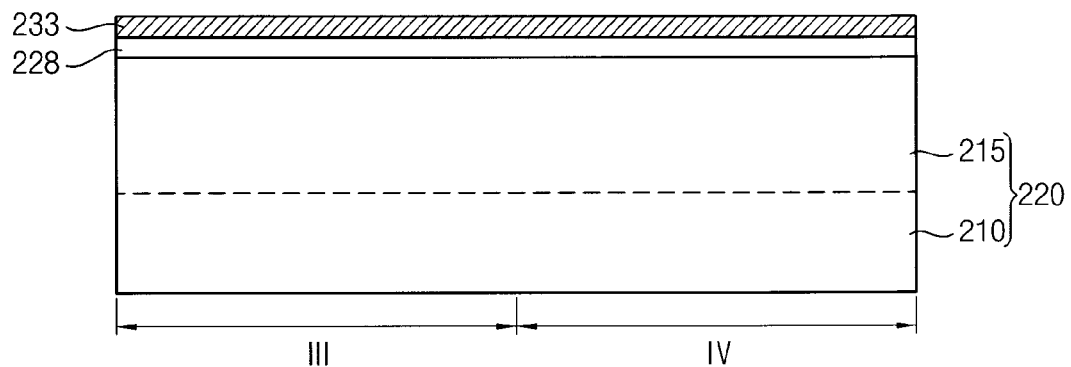

Referring now to FIG. 16C, a preliminary barrier layer 228 and a preliminary conductive layer 233 are sequentially formed over an entire surface of the second substrate 220. The method of forming the preliminary layers 228 and 233 is not limited, and conventional deposition techniques may be utilized.

Figure 16D:
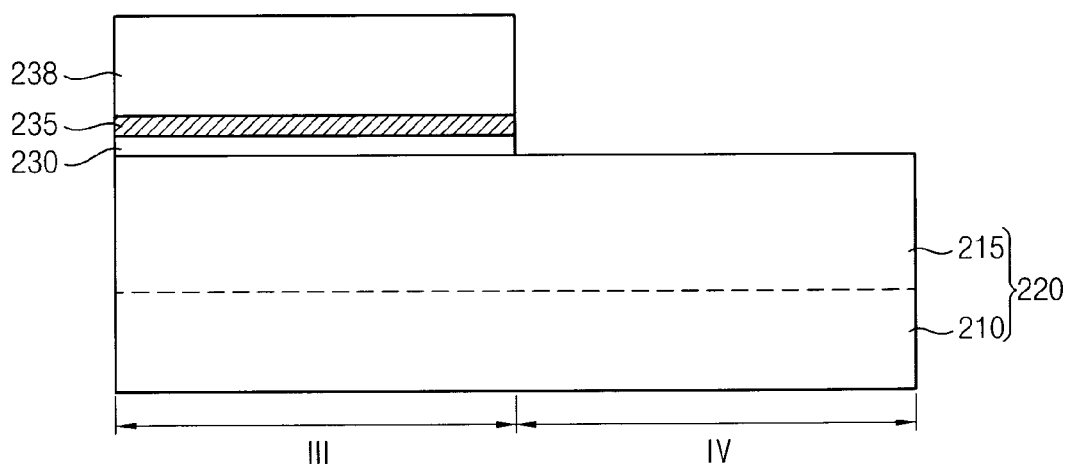

As shown in FIG. 16D, a mask pattern 238 is formed to cover the preliminary conductive layer 233 (see FIG. 16C) in a first region III of the second substrate 220. Then the preliminary barrier layer 228 and a preliminary conductive layer 233 are selectively removed by etching to define a barrier layer 230 and a conductive wiring layer 235 at the first region III of the second substrate 220.

Figure 16E:
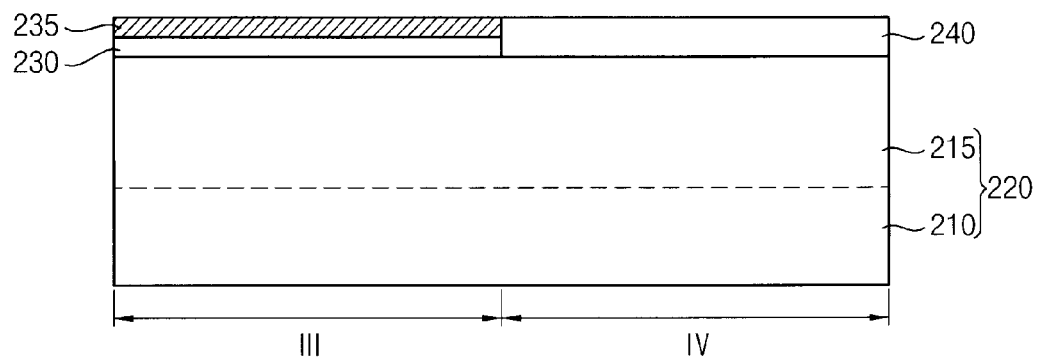

Next, referring to FIG. 16E, a compensation layer 240 is formed on a second region IV of the surface of the second substrate 220.

One example method of forming the compensation layer 240 is to remove the mask pattern 238 (see FIG. 16D), and then to form a preliminary compensation layer over the first and the second regions III and IV of the second substrate 220. Then a CMP process and/or an etch-back process may be executed to partially remove the preliminary compensation layer so as to expose an upper surface of the conductive wiring layer 235. As a result, the compensation layer 240 is defined adjacent the stack of the barrier layer 230 and the conductive wiring layer 235.

Another example method of forming the compensation layer 240 may keep the mask pattern 238 (see FIG. 16D) in place, and to execute an epitaxial growth process at the exposed surface (the second region IV) of the second substrate 220. In this example, the compensation layer 240 may be an epitaxial growth layer having the same crystalline structure as the underlying second substrate 220.

Next, although not shown in the drawings, the first substrate 200 is attached (bonded) to the second substrate 220 such that the insulating layer 205 of the first substrate 200 is aligned with the conductive wiring layer 235 of the second substrate 220, and such that the exposed surface of the first substrate 200 is aligned with the compensation layer 240 of the second substrate 220. The method of attachment is not limited, and examples may include attachment by a heat treatment, an adhesion layer, a plasma treatment and/or a UV treatment.

After attachment of the first and the second substrates 200 and 220, the sacrificial layer 210 of the second substrate 220 is removed to result in the substrate structure of FIG. 15 described above. The method of removal is not limited, and examples of removal techniques may include laser cutting, grinding, CMP and/or etching. The sacrificial layer 210 may also be removed by cleaving, particularly in the case where the sacrificial layer 210 may be defined using the ion implantation technique discussed above in connection with FIG. 3.

As with the previous embodiments, the inclusion of the sacrificial layer 210 is effective to add additional strength and/or rigidity to the second substrate 220 during the bonding process. Then, by removing the sacrificial layer 210 after bonding, an overall thickness of the substrate structure is reduced.

Another embodiment of the inventive concepts will now be described with reference to the cross-sectional view of FIG. 17. In particular, FIG. 17 is a cross-sectional view of a substrate structure including a buried wiring according to another embodiment of the inventive concepts.

Figure 17:
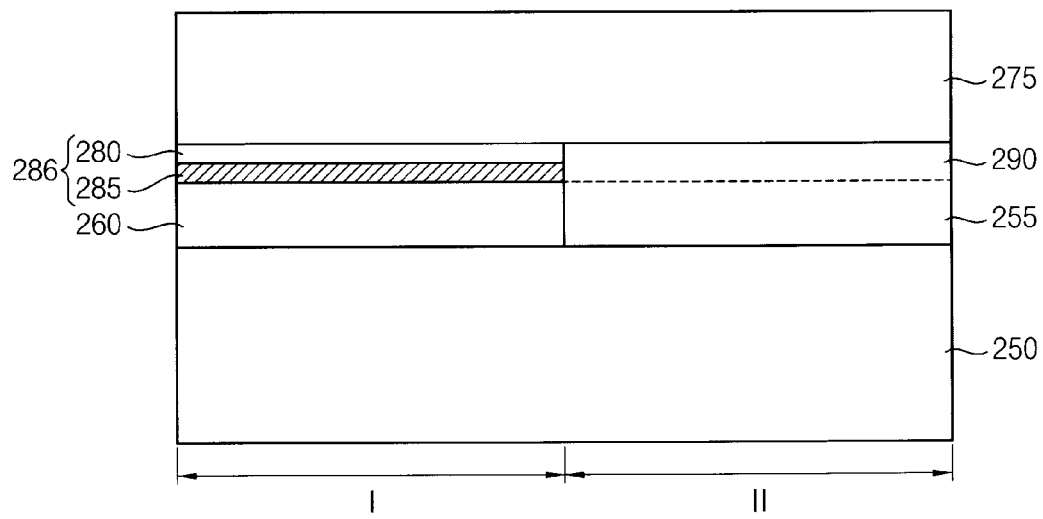
FIG. 17 is a cross-sectional view of a substrate structure according to an embodiment of the inventive concepts.

Referring to FIG. 17, the substrate structure of this example includes a first substrate 250 and a second substrate 275. Examples of the first substrate 250 and the second substrate 275 may include a silicon substrate, a germanium substrate, a silicon-germanium substrate, a SOI substrate, a GOI substrate, a metal oxide substrate, etc. The first and the second substrates 250 and 275 may be formed of the same substrate material or different substrate materials.

The substrate structure of FIG. 17 includes a first region I and a second region II. For example, the first region I may be a memory cell array region of a semiconductor memory device, and the second region II may be a peripheral circuit region of the semiconductor memory device.

In the example of this embodiment, an insulating layer 260 and a buried wiring 286 are stacked in the first region I between the first and the second substrates 250 and 275 as shown in FIG. 17. In the example of this embodiment, the buried wiring 286 includes a barrier layer 280 and a conductive wiring layer 285. In an alternative embodiment, the barrier layer 280 may be omitted, and the buried wiring 286 may be defined by the conductive wiring layer 285.

Material examples of the insulating layer 260 may include oxides, such as silicon oxides, and other dielectric materials.

Material examples of the conductive wiring layer 285 may include doped polysilicon, W, Ti, Ta, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, $ZrN_x$, and combinations of any one or more of these.

Material examples of the barrier layer 280 may include Ti, $TiN_x$, $TiSi_x$, Ta, $TaN_x$, $TaSi_x$, Mo, $MoN_x$, Hf, $HfN_x$, W, $WN_x$, WSi$_x$, Zr, ZrN$_x$, ZrSi$_x$, Ni, NiSi$_x$, Al, AlN$_x$, CoSi$_x$, and combinations of two or more of these.

In the example of the illustrated embodiment, an upper surface of the buried wiring 286 may directly contact the second substrate 275. That is, in the illustrated example, an upper surface of the barrier layer 280 directly contacts a lower surface of the second substrate 275. However, as mentioned above, an alternative embodiment is where all or part of the barrier layer 280 may be omitted. In this case, all or part of an upper surface of the conductive wiring layer 285 may directly contact the second substrate 275.

Also in the example of this embodiment, first and second compensation layers 255 and 290 are interposed at the second region II between the first and the second substrates 250 and 275. The first compensation layer 255 may have a same thickness as the insulating layer 260, and may, for example, be formed of an undoped polysilicon and/or semiconductor material. The second compensation layer 290 may have a same thickness as the conductive wiring layer 185 and barrier layer 280, and may also, for example, be formed of undoped polysilicon and/or semiconductor material. The first and the second compensation layers 255 and 290 may be formed of a same material or different materials.

A method of fabricating the substrate structure of FIG. 17 will now be described with reference to the cross-sectional views of FIG. 18A through FIG. 18C.

Figure 18A:
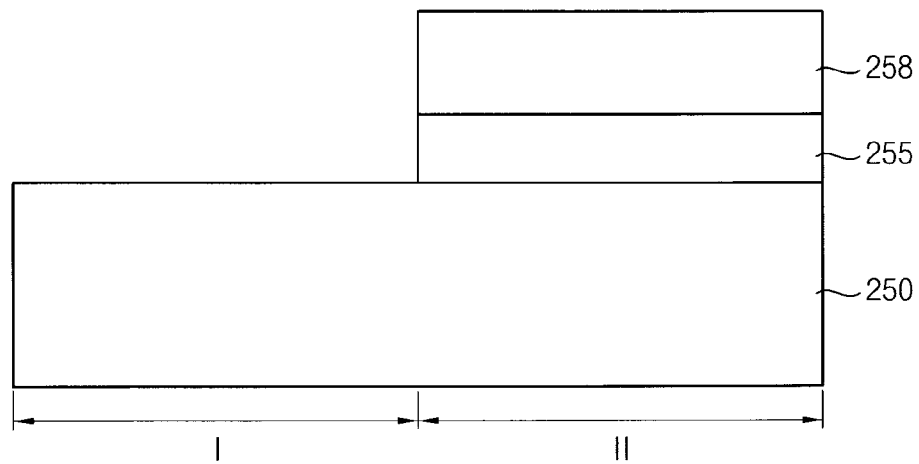
FIGS. 18A through 18C are cross-sectional views for use in explaining a method of fabricating the substrate structure of FIG. 17 according to an embodiment of the inventive concepts.

Referring to FIG. 18A, a first compensation layer 255 is formed on a second region II of a first substrate 255. This may be achieved, for example, by forming a preliminary compensation layer over an entire surface of the first substrate 250 using conventional deposition techniques, and then by selective removing the preliminary compensation layer using a mask pattern 258 as an etching mask.

Figure 18B:
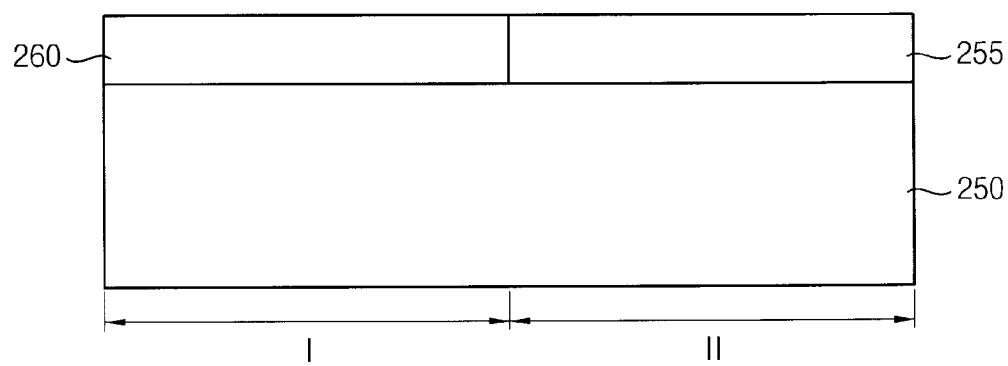

Next, referring to FIG. 18B, an insulating layer 260 is formed in a first region I of the first substrate 250 adjacent the first compensation layer 255.

One example method of forming the insulation layer 260 is to remove the mask pattern 258 (see FIG. 16A), and then to form a preliminary insulation layer over the first and the second regions I and II of the first substrate 250. Then, a CMP process and/or an etch-back process may be executed to partially remove the preliminary insulating layer so as to expose an upper surface of the first compensation layer 255. As a result, the insulating layer 260 is defined adjacent the first compensation layer 255.

Another example method of forming the insulation layer 260 may keep the mask pattern 258 (see FIG. 18A) in place, and to execute an oxidation process to form the insulation layer 260 at the exposed surface (the first region I) of the first substrate 250. The mask pattern 258 is then removed, and the insulating layer 260 is defined adjacent the first compensation layer 255.

Figure 18C:
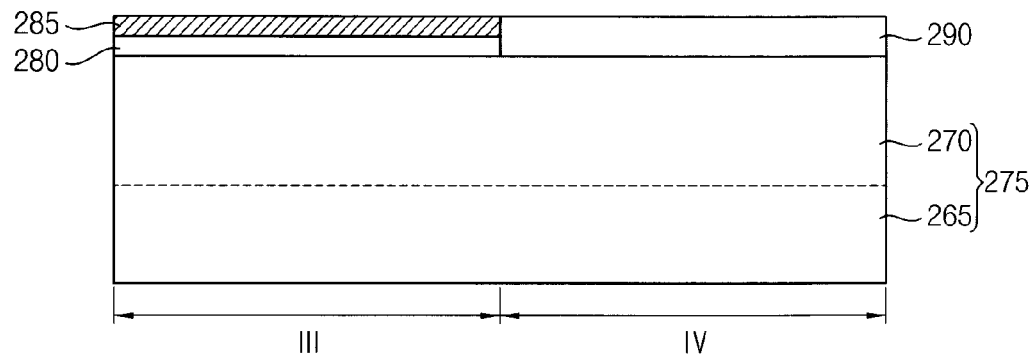

Referring to FIG. 18C, a second substrate 275 is provided which includes a semiconductor layer 270 and a sacrificial layer 265. The second substrate 275 may be formed of a single contiguous material, in which case the semiconductor layer 270 and the sacrificial layer 265 are formed of the same material. In this case, the sacrificial layer 265 simply defines a portion of the second substrate 275 that is to be later removed. Alternatively, the sacrificial layer 265 may constitute a different material layer than the semiconductor layer 270. Further, the sacrificial layer 265 may be defined using the same ion implantation technique discussed above in connection with FIG. 3.

Still referring to FIG. 18C, a barrier layer 280 and a conductive wiring layer 285 are stacked over a first region III of the second substrate 275, and a compensation region 290 is formed over a second region IV of the second substrate 275. The may be achieved, for example, utilizing the same processes described above in connection with FIGS. 16C through 16E.

Next, although not shown in the drawings, the first substrate 250 is attached (bonded) to the second substrate 275 such that the insulating layer 260 of the first substrate 250 is aligned with the conductive wiring layer 285 of the second substrate 275, and such that the first compensation layer 255 of the first substrate 250 is aligned with the second compensation layer 290 of the second substrate 275. The method of attachment is not limited, and examples may include attachment by a heat treatment, an adhesion layer, a plasma treatment and/or a UV treatment.

After attachment of the first and the second substrates 250 and 275, the sacrificial layer 265 of the second substrate 275 is removed to result in the substrate structure of FIG. 17 described above. The method of removal is not limited, and examples of removal techniques may include laser cutting, grinding, CMP and/or etching. The sacrificial layer 265 may also be removed by cleaving, particularly in the case where the sacrificial layer 265 may be defined using the ion implantation technique discussed above in connection with FIG. 3.

As with the previous embodiments, the inclusion of the sacrificial layer 265 is effective to add additional strength and/or rigidity to the second substrate 275 during the bonding process. Then, by removing the sacrificial layer 265 after bonding, an overall thickness of the substrate structure is reduced.

Semiconductor devices in accordance with the inventive concepts will now be described with reference to a number of example embodiments.

Figure 19:
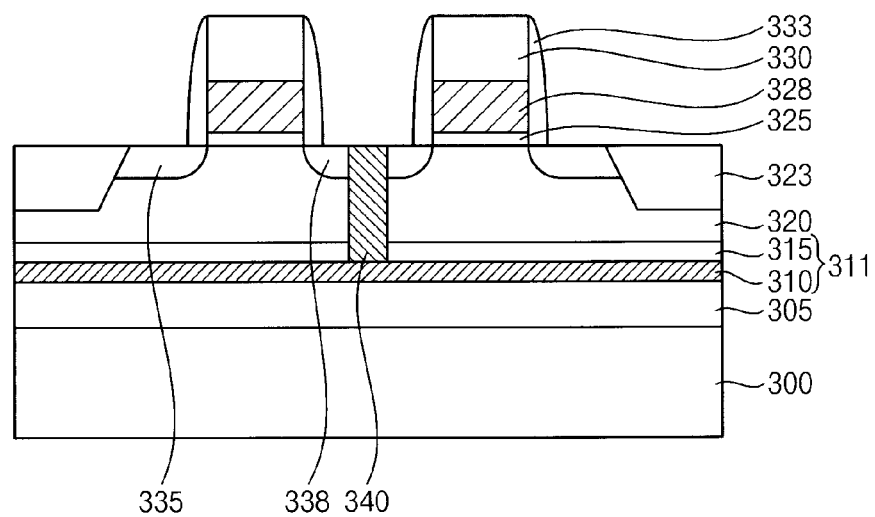
FIG. 19 is a cross-sectional view of a semiconductor device according to an embodiment of the inventive concepts.

FIG. 19 is a cross-sectional view of a semiconductor device in accordance with an embodiment of the inventive concepts.

Referring to FIG. 19, the semiconductor device of this example has a substrate structure substantially the same as or substantially similar to that of the embodiment of previously described FIG. 1. Namely, the substrate structure of FIG. 19 includes a first substrate 300, an insulating layer 305, a buried wiring 311, and a second substrate 320. The buried wiring 311 may in direct contact with the second substrate 320, and includes a conductive wiring layer 310 and a barrier layer 315. It is noted, however, that substrate structures of other embodiments of the inventive concepts may be adopted instead in the configuration of FIG. 19.

An active region, defined between isolation regions 323 of the second substrate 320, includes two transistors electrically connected to the buried wiring 311. In particular, each transistor includes a gate structure aligned between source/drain regions 335 and 338 formed in the second substrate 320. Each gate structure of this example includes a gate oxide 325, a gate electrode 328, a gate mask 330 and sidewall spacers 333.

A contact plug 340 electrically connects the source/drain region 338 and the buried wiring 311. In this example, the contact plug 338 extends through the second substrate 320 and the barrier layer 315 to contact the conductive wiring layer 310 of the buried wiring 311. Here, the buried wiring 311 may be utilized as a bit line, a word line or an interconnection line of the semiconductor device.

Figure 20:
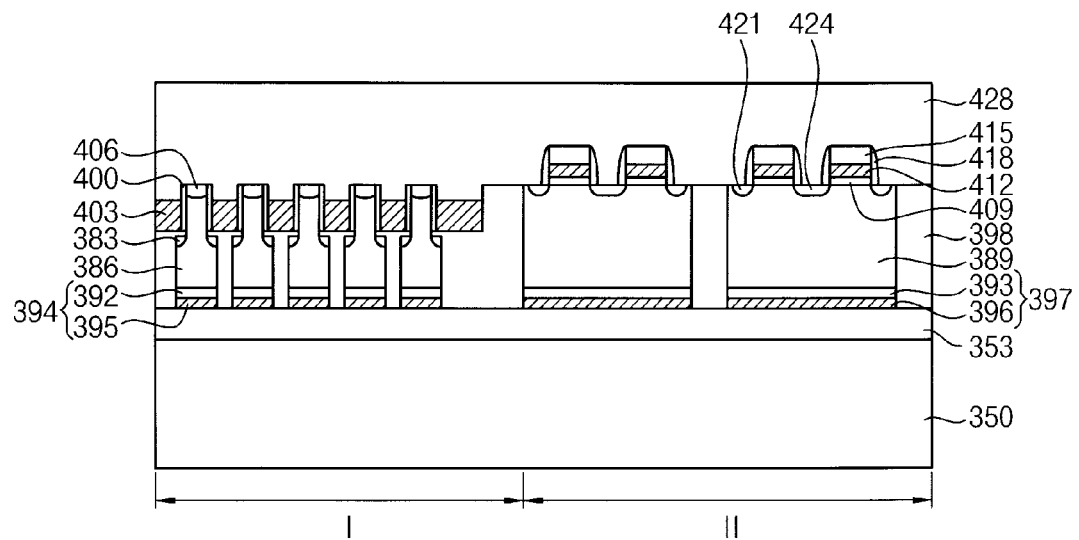
FIG. 20 is a cross-sectional view of a semiconductor device according to an embodiment of the inventive concepts.

FIG. 20 is a cross-sectional view of a semiconductor device in accordance with another embodiment of the inventive concepts.

Referring to FIG. 20, the semiconductor device of this example has a substrate structure substantially similar to that of the embodiment of previously described FIG. 1, except that the substrate structure of this example includes separate buried wirings 394 and 397 in a memory cell region I and a peripheral circuit region II, respectively. Namely, the substrate structure of FIG. 20 includes a first substrate 350, an insulating layer 353, a first buried wiring 394 in the memory cell region I, a second buried wiring 397 in the peripheral circuit region II, and a second substrate including a first active region 386 in the memory cell region I and a second active region 389 in the peripheral circuit region II. The first buried wiring buried wiring 394 is in direct contact with the first active region 386 (pillar structures), and the second buried wiring 397 is in direct contact with the second active region 389. Further, the first buried wiring 394 include a conductive wiring layer 395 and a barrier layer 392, and the second buried wiring 397 include a conductive wiring layer 396 and a barrier layer 393. It is noted, however, that substrate structures of other embodiments of the inventive concepts may be adopted instead in the configuration of FIG. 20.

The memory cell region I of the semiconductor device of FIG. 20 includes a plurality of vertical channel transistors. Each vertical transistor includes a gate electrode 403 and a pillar structure 386 of active region silicon. For example, each transistor may be a vertical pillar transistor (VPT) in which the gate electrode 403 surrounds a cylindrical pillar 386. As another example, each transistor may be a vertical channel transistor (VCT) in which the gate electrode 403 contacts at least one side of a polygonal pillar 386. Further, each vertical transistor includes a gate dielectric 400, and impurity regions (source/drain regions) 383 and 406.

The peripheral circuit region II of the semiconductor device of FIG. 20 includes a plurality of MOS transistors. Here, each MOS transistor includes a gate structure of a gate dielectric 409, a gate electrode 412, a gate mask 415 and sidewall spacers 418. Further, impurity regions 421 and 424 are formed in the second active region 389 to define source/drain regions of the MOS transistors.

Also shown in FIG. 20 are interlayer dielectric layers 398 and 428.

In the semiconductor device of FIG. 20, the buried wiring 394 of the memory cell region I may be utilized, for example, as a bit line, word line and/or interconnection line of the semiconductor device. For example, the buried wiring 394 and a contact plug (not shown) may constitute a source/drain electrode of the semiconductor device. In one example embodiment, the gate electrode 403 is a word line, and the buried wiring 394 is a bit line. Likewise, the buried wiring 397 of the peripheral circuit region II may be utilized, for example, as a bit line, a word line and/or an interconnection line.

A method of fabricating the semiconductor device of FIG. 20 will now be described with reference to FIGS. 21A through 21G. Those skilled in the art will be well acquainted with fabrication techniques that may be utilized to realize the fabrication method, and thus details of process parameters and the like are omitted for the sake of brevity.

Figure 21A:
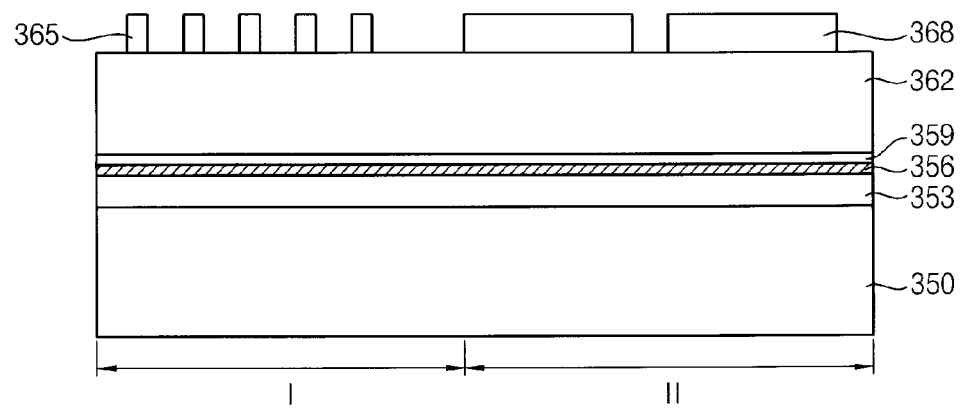
FIGS. 21A through 21G are cross-sectional views for use in explaining a method of fabricating the semiconductor device of FIG. 20 according to an embodiment of the inventive concepts.

Referring to FIG. 21A, a substrate structure such as that shown in FIG. 1 is provided. In the illustration of FIG. 21A, the substrate structure includes a first substrate 350, an insulating layer 353, a conductive wiring layer 356, a barrier layer 359 and a second substrate 362. Here, the conductive wiring layer 356 and the barrier layer 359 correspond to those of the buried wiring 41 of FIG. 1.

Still referring to FIG. 21A, a first mask pattern 365 is formed on the second substrate 362 in a memory cell region I of the substrate structure, and a second mask pattern 368 is formed on the second substrate 362 in a peripheral circuit region II of the substrate structure. An active region of the second substrate 362 in the memory cell region I is referred to as a first active region, and an active region of the second substrate 362 in the peripheral circuit region II is referred to as a second active region.

Figure 21B:
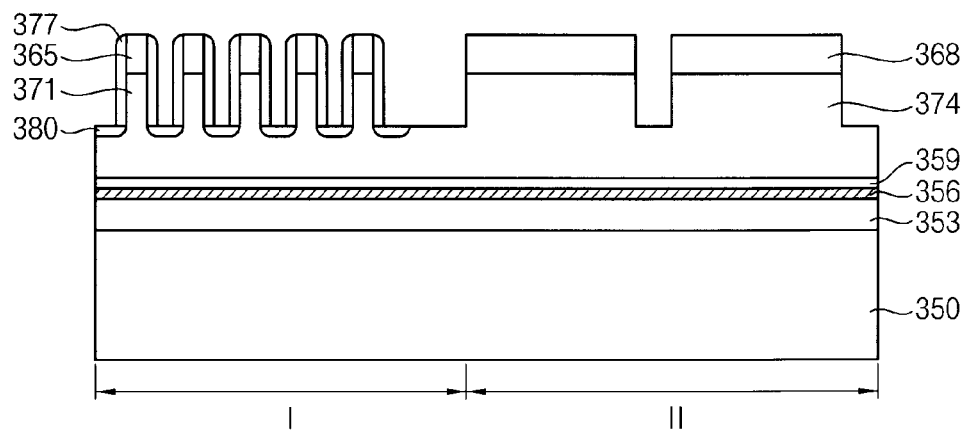

Turning to FIG. 21B, an upper portion 371 of the first active region is etched using the first mask pattern 365 as an etching mask, to thereby define a plurality of pillar structures in the upper portion 371 of the first active region. Likewise, an upper portion 374 of the second active region is etched using the second mask pattern 368 as an etching mask, to thereby define a plurality of transistor active regions in the upper portion 374 of the second active region. Further, sidewall spacers 377 are formed on the pillar structures of the upper portion 317 the first active region, and preliminary impurity regions 380 are implanted in the first active region exposed by the sidewall spacers 377. Further, although not shown in the figure, an additional contact plug or an additional interconnection may be formed to electrically connect the preliminary impurity region 380 to the conductive wiring layer 356. In this manner, the contact plug or the interconnection, together with the conductive wiring layer 356, may constitute a source/drain electrode of the semiconductor device.

Figure 21C:
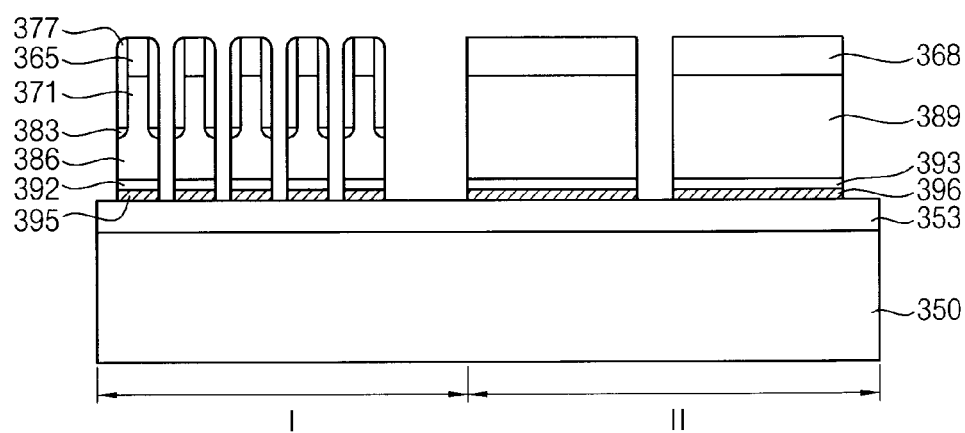

Referring to FIG. 21C, another etch process is carried out using the sidewall spacers 377 and the first and the second mask patterns 365 and 368 as etching masks. The etching is carried out until a surface of the insulating layer 353 is exposed. In this manner, the impurity regions 386 and the pillar structures of the first active region 386 are defined, and the second active regions 389 are defined. In addition, a plurality of buried wirings 395/392 are formed in the first active region 386, and a plurality of buried wirings 396/393 are formed in the second active region 389 are formed.

Figure 21D:
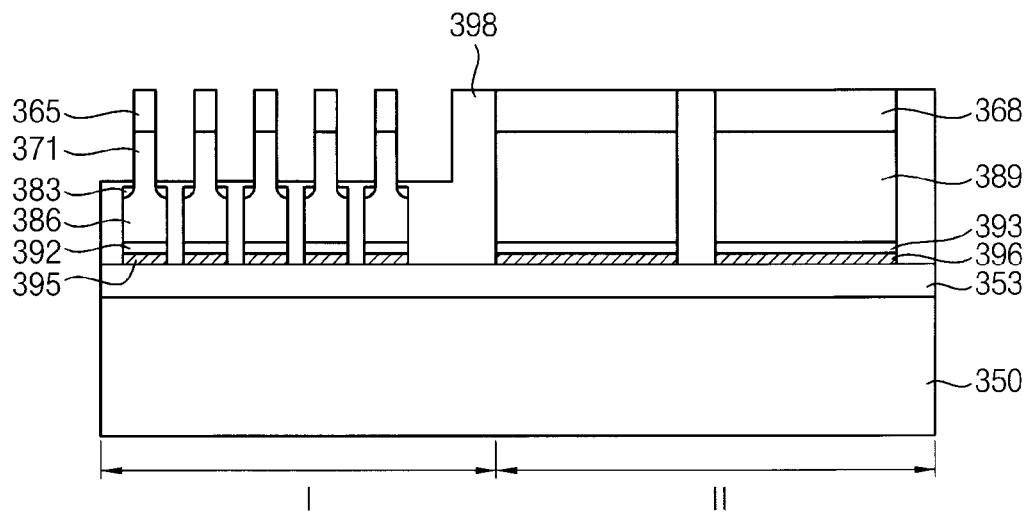

Referring now to FIG. 21D, the sidewall spacers 377 (see FIG. 21C) are removed from the first active region 386, and a first interlayer dielectric layer 398 so that the upper portion 371 of the first active region 386 is exposed, and such that the mask pattern 368 of the second active region 389 is exposed.

Figure 21E:
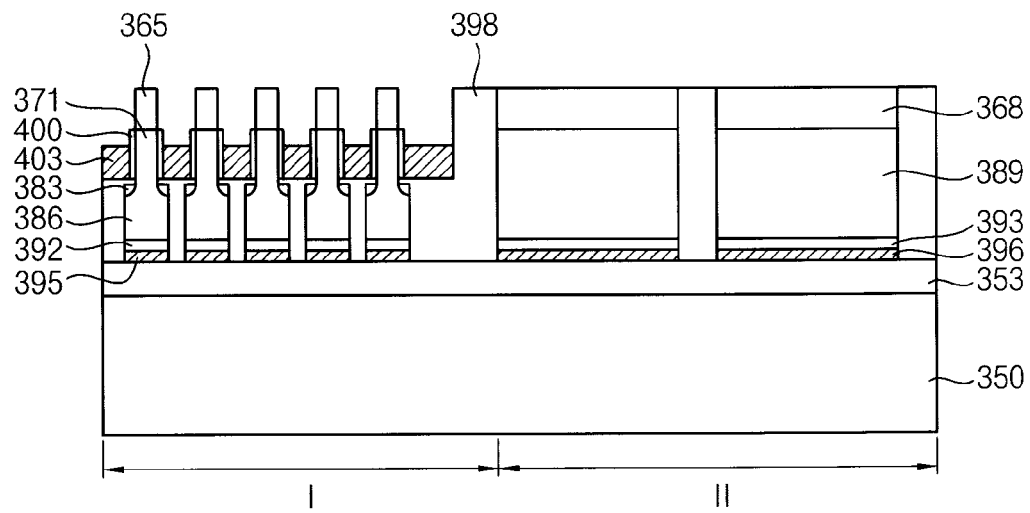

Referring to FIG. 21E, a gate dielectric layer 400 is formed in the upper portion 371 of the first active region 386, and then a gate electrode 403 is formed on the gate dielectric layer 400. For example, in the case where each transistor is a vertical pillar transistor (VPT), the gate electrode 403 is formed to surround cylindrical pillars of the first active region 386. As another example, in the case where each transistor is a vertical channel transistor (VCT), the gate electrode 403 is formed contact the gate dielectric layer 400 on at least one side of a polygonal pillar of the first active region 386.

Figure 21F:
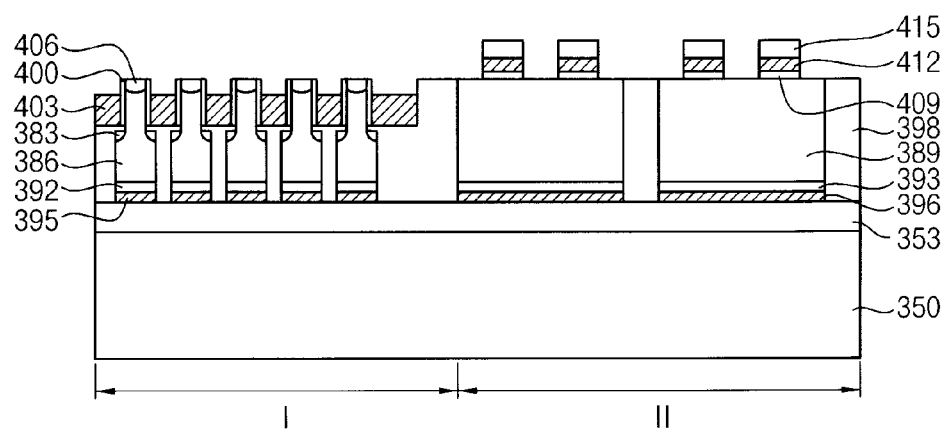

Referring to FIG. 21F, the first mask pattern 365 (see FIG. 21E) is removed, and second impurity regions 406 are formed in the exposed upper portions of the first active region 386. Further, the second mask pattern 368 is removed, and gate structures including a gate dielectric layer 409, a gate electrode 412 and a gate mask 415 are formed on the expose second active region 389.

Figure 21G:
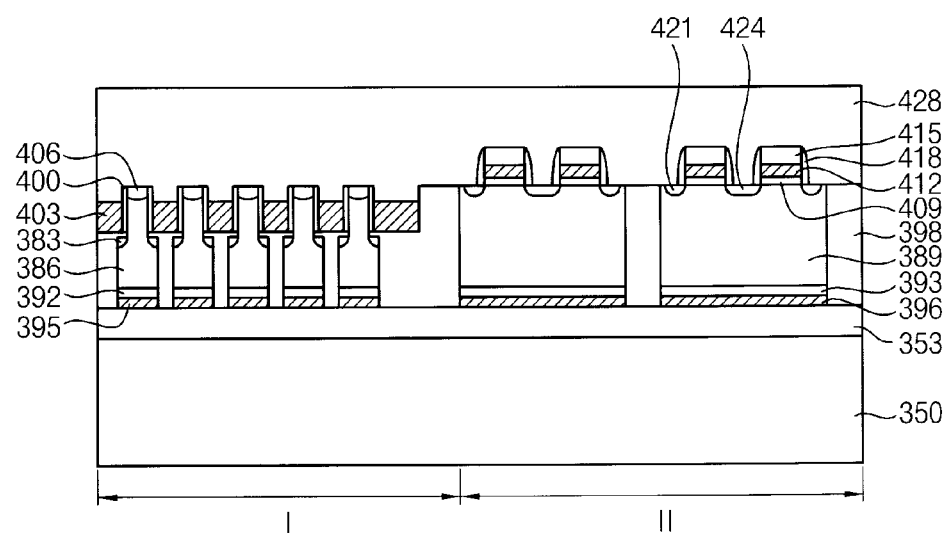

Referring to FIG. 21G, sidewall spacers 418 are formed on the gate structures of the second active region 389, and impurity regions 421 and 424 are formed in the second active region 389 using the sidewall spacers 418 and gate masks 415 as implantations masks. Finally, a second interlayer dielectric layer 428 is formed on the resultant structure.

Many variations of the semiconductor device configuration of FIG. 20 will become apparent to those skilled in the art. Some of those variations will be described next with reference to FIGS. 22 through 26. In the discussion that follows, like reference numbers refer to like elements, and detailed discussion of already described elements is omitted.

Figure 22:
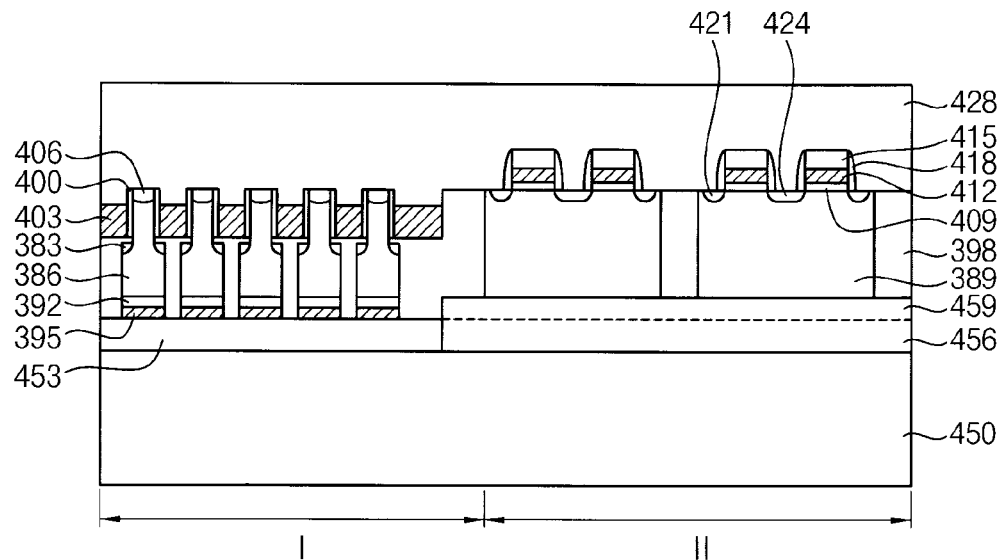
FIGS. 22 through 25 and FIG. 27 are cross-sectional views of semiconductor devices according to respective embodiments of the invention.

FIG. 22 depicts an embodiment of the inventive concepts in which substrate structure of FIG. 17 is adopted in the semiconductor device of FIG. 20. Thus, in contrast to the configuration of FIG. 20, the configuration of FIG. 22 includes a first substrate 450, a first insulating layer 453 in a memory cell region I, and first and second compensation layers 456 and 459 in a peripheral circuit region II. In this example, no buried wiring is present in the peripheral circuit region II.

Figure 23:
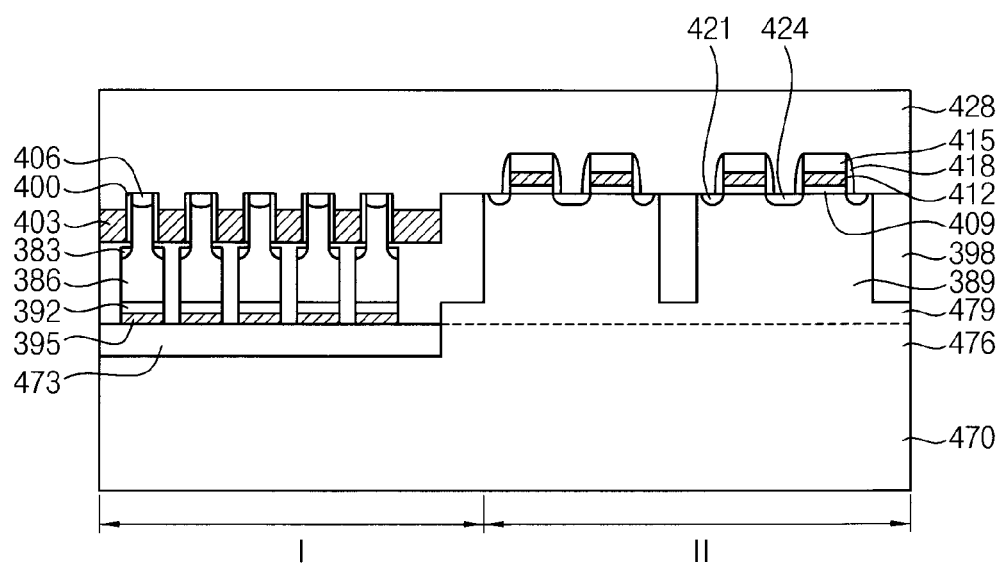

FIG. 23 depicts an embodiment of the inventive concepts in which substrate structure of FIG. 6 is adopted in the semiconductor device of FIG. 20. Thus, in contrast to the configuration of FIG. 20, the configuration of FIG. 23 includes a first substrate 470, a first insulating layer 473 in a memory cell region I, and contacting protruding portions 476 and 479 of first and second substrates 470 and 389 in a peripheral circuit region II. In this example, no buried wiring is present in the peripheral circuit region II.

Figure 24:
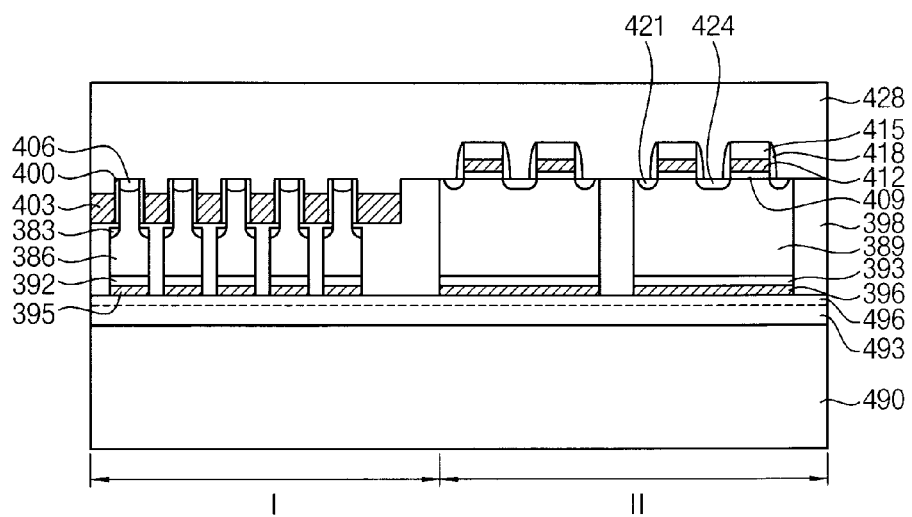

FIG. 24 depicts an embodiment of the inventive concepts in which substrate structure of FIG. 4 is adopted in the semiconductor device of FIG. 20. Thus, in contrast to the configuration of FIG. 20, the configuration of FIG. 24 includes a first substrate 490, a first insulating layer 493 in a memory cell region I and a peripheral circuit region II, and a second insulating layer 496 in the memory cell region I and peripheral circuit region II.

Figure 25:
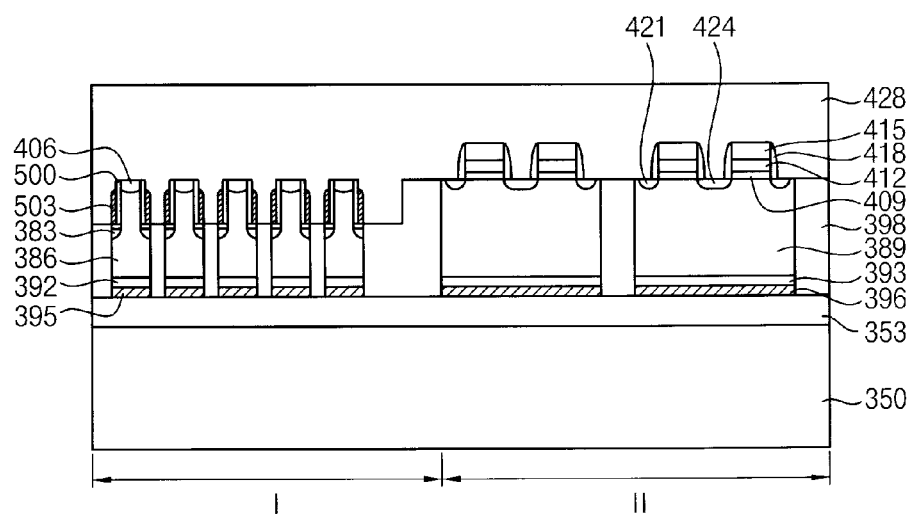
Figure 26:
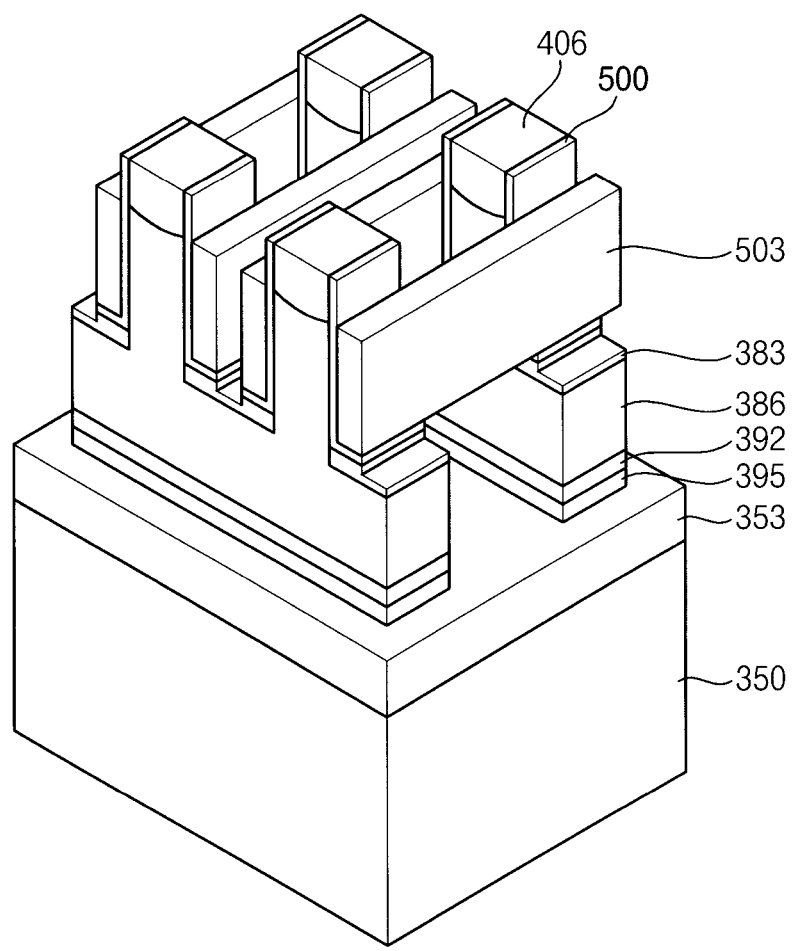
FIG. 26 is a perspective view of the semiconductor device of FIG. 25 according to an embodiment of the inventive concepts.

FIG. 25 depicts an embodiment of the inventive concepts in which substrate structure of FIG. 1 is adopted in the semiconductor device, similar to that of FIG. 20. FIG. 25 is a cross-sectional view of the semiconductor device according to an embodiment of the inventive concepts and FIG. 26 is a perspective view illustrating the semiconductor device of FIG. 25. However, the configurations of FIG. 25 and FIG. 26 are characterized by gate dielectrics 500 and gate electrodes 503 having the configuration of sidewall spacers in the upper portions of the first active regions 386. This configuration may be particularly adaptable to VCT devices.

Figure 27:
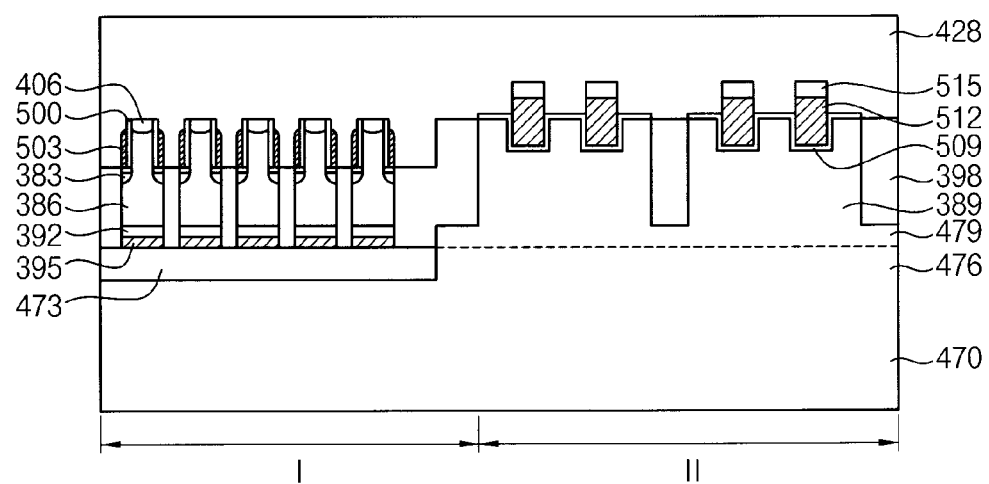

FIG. 27 depicts an embodiment of the inventive concepts in which substrate structure of FIG. 6 is adopted in the semiconductor device of FIG. 25. Thus, in contrast to the configuration of FIG. 25, the configuration of FIG. 27 includes a first substrate 470, a first insulating layer 473 in a memory cell region I, and contacting protruding portions 476 and 479 of first and second substrates 470 and 389 in a peripheral circuit region II. In this example, no buried wiring is present in the peripheral circuit region II.

In addition, the example of FIG. 27 contains a further modification in which the planar MOS transistors are replaced with recess channel transistors (RCAT) or buried channel transistors (BCAT). In the example shown in FIG. 26, each transistor includes a gate dielectric layer 509 formed on sidewalls of a recess in a second active region 389, a gate electrode 512 located in the recess and extending above a surface of the second active region 389, and a gate mask 515.

As demonstrated by the above examples, a substrate structure of the inventive concepts that is configured in a semiconductor device may be replaced in favor of another substrate structure of inventive concepts.

A substrate structure and/or semiconductor device in accordance with one or more of the inventive concepts may be housed on or within any of a variety of different package types. For example, a flash memory device in accordance with one or more of the inventive concepts may be housed on or within a Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A substrate structure having a first region and a second region discrete from and disposed laterally of the first region and, comprising:
a first substrate and a second substrate juxtaposed with the first substrate in a vertical direction in both the first and second regions of the substrate structure;
buried wiring comprising an electrically conductive wiring layer,
wherein the buried wiring contacts the second substrate in the first region of the substrate structure, and the second region of the substrate structure is devoid of the buried wiring and includes a source/drain region; and
a contact plug extending through the second substrate from the source/drain region to the wiring layer of the buried wiring.

2. The substrate structure of claim 1, wherein the buried wiring further comprises a barrier layer, and the barrier layer contacts the second substrate in the first region of the substrate structure.

3. The substrate structure of claim 2, wherein the wiring layer is of at least one material selected from the group consisting of doped polysilicon, W, Ti, Ta, Mo, Ir, Hf, Zr, Ru, Pt, Ni, Al, $WN_x$, $AlN_x$, $TaN_x$, $TiN_x$, $TiAl_xN_y$, $MoN_x$, $HfN_x$, and $ZrN_x$.

4. The substrate structure of claim 3, wherein the barrier layer is at least one film of material selected from the group consisting of Ti, $TiN_x$, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, and $CoSi_x$.

5. The substrate structure of claim 1, wherein each of the second and first substrates independently consists of a silicon substrate, a germanium substrate, a silicon-germanium substrate, an SOI (Silicon-On-Insulator) substrate, and a GOI (Germanium-On-Insulator) substrate.

6. The substrate structure of claim 2, further comprising an insulating layer interposed between the first substrate and the wiring layer.

7. The substrate structure of claim 1, wherein the buried wiring is a bit line or a word line.

8. The substrate structure of claim 1, wherein the buried wiring is an interconnection line.

9. The substrate structure of claim 1, wherein the first and second substrates contact one another throughout the second region of the substrate structure.

10. The substrate structure of claim 9, wherein the first region is a memory cell region, and the second region is a peripheral circuit region.

11. The substrate structure of claim 1, further comprising an insulating layer, and wherein the buried wiring and the insulating layer are interposed between the second and first substrates in the first region of the substrate structure, and the insulating layer is interposed between the second and first substrates in the second region of the substrate structure.

12. The substrate structure of claim 11, wherein the insulating layer includes a stack of two different insulating materials.

13. The substrate structure of claim 1, further comprising an insulating layer and a compensation layer, and wherein the buried wiring and the insulating layer are interposed between the second and first substrates in the first region of the substrate structure, and the compensation layer is interposed between the second and first substrates in the second region of the substrate structure, and the combined thickness of the buried wiring and the first insulating layer is the same as the thickness of the compensation layer.

14. The substrate structure of claim 13, wherein the compensation layer comprises at least one of an undoped polysilicon material and a semiconductor material.

15. The substrate structure of claim 1, wherein the buried wiring consists of the electrically conductive wiring layer.

16. The substrate structure of claim 15, wherein each of the second and first substrates independently consists of one of a silicon substrate, a germanium substrate, a silicon-germanium substrate, an SOI (Silicon-On-Insulator) substrate, and a GOI (Germanium-On-Insulator) substrate.

17. The substrate structure of claim 1, wherein the buried wiring consists of the layer of electrically conductive wiring and a barrier layer of at least one film of material selected from the group consisting of Ti, $TiN_x$, $TiSi_x$, Ta, $TaN_x$, $TaSi_x$, Mo, $MoN_x$, Hf, $HfN_x$, W, $WN_x$, $WSi_x$, Zr, $ZrN_x$, $ZrSi_x$, Ni, $NiSi_x$, Al, $AlN_x$, and $CoSi_x$, and the barrier layer contacts the second substrate.

18. The substrate structure of claim 17, wherein each of the second and first substrates independently consists of one of a silicon substrate, a germanium substrate, a silicon-germanium substrate, an SOI (Silicon-On-Insulator) substrate, and a GOI (Germanium-On-Insulator) substrate.

19. The substrate structure of claim 1, wherein the electrically conductive wiring layer consists of a layer of conductive material extending substantially parallel to the first and second substrates in the first region.

\* \* \* \* \*